(12) United States Patent
Bae et al.

(10) Patent No.: US 11,088,216 B2
(45) Date of Patent: Aug. 10, 2021

(54) COLOR CONTROL MEMBER AND DISPLAY DEVICE EMPLOYING THE SAME

(71) Applicant: Samsung Display Co., Ltd., Yongin-si (KR)

(72) Inventors: Kwangsoo Bae, Yongin-si (KR);
Beomsoo Park, Yongin-si (KR);
Minjeong Oh, Yongin-si (KR);
Youngje Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/737,481

(22) Filed: Jan. 8, 2020

(65) Prior Publication Data

US 2020/0343310 A1   Oct. 29, 2020

(30) Foreign Application Priority Data

Apr. 23, 2019   (KR) .................. 10-2019-0047520

(51) Int. Cl.
*H01L 27/32* (2006.01)
*H01L 51/52* (2006.01)
(Continued)

(52) U.S. Cl.
CPC ........ *H01L 27/322* (2013.01); *H01L 27/3216* (2013.01); *H01L 27/3218* (2013.01);
(Continued)

(58) Field of Classification Search
CPC .............. H01L 27/322; H01L 27/3272; H01L 27/3246; H01L 27/3216; H01L 27/3218;
(Continued)

(56) References Cited

U.S. PATENT DOCUMENTS 7,307,382 B2   12/2007   Uhlig et al.
10,048,412 B2   8/2018   Li
(Continued)

FOREIGN PATENT DOCUMENTS

| JP | 2012-104430 | 5/2012 |
| KR | 10-0567223 | 4/2006 |
| KR | 10-2018-0092326 | 8/2018 |

*Primary Examiner* — Mohsen Ahmadi
(74) *Attorney, Agent, or Firm* — Kile Park Reed & Houtteman PLLC

(57) ABSTRACT

A color control member includes a substrate including a first pixel area and a second pixel area; a first color conversion layer converting incident light on the first color conversion layer to light of a first color, the light of the first color being emitted from the first color conversion layer and through the first pixel area; a second color conversion layer converting incident light on the second color conversion layer to light of a second color, the light of the second color being emitted through the second color conversion layer and through the second pixel area; and a partition wall disposed between the first color conversion layer and the second color conversion layer to correspond to a light-blocking area of the substrate in which the light emitted from the first color conversion layer or the second color conversion layer is blocked from being emitted to the other thereof.

15 Claims, 44 Drawing Sheets

(51) Int. Cl.
*G02F 1/1335* (2006.01)
*G02B 5/20* (2006.01)

(52) U.S. Cl.
CPC ...... *H01L 27/3246* (2013.01); *H01L 27/3272* (2013.01); *H01L 51/5268* (2013.01)

(58) Field of Classification Search
CPC ............ H01L 27/3251; H01L 51/5268; G02F 1/1343; G02F 1/133504; G02F 1/136286
See application file for complete search history.

(56) References Cited

U.S. PATENT DOCUMENTS

| | | |
|---|---|---|
| 2010/0013741 A1 | 1/2010 | Watanabe |
| 2012/0007067 A1* | 1/2012 | Kaneta ................ H01L 51/5088 257/40 |
| 2014/0160408 A1 | 6/2014 | Cho et al. |
| 2014/0319479 A1* | 10/2014 | Park ................... H01L 27/3216 257/40 |
| 2015/0124188 A1 | 5/2015 | Kadowaki et al. |
| 2015/0221870 A1 | 8/2015 | Shintani et al. |
| 2016/0041430 A1 | 2/2016 | Lee et al. |
| 2016/0357039 A1 | 12/2016 | Kim et al. |
| 2017/0090247 A1* | 3/2017 | Lee ....................... B82Y 30/00 |
| 2017/0269435 A1 | 9/2017 | Yoon et al. |
| 2018/0059310 A1* | 3/2018 | Bae ....................... G02B 6/005 |
| 2018/0088404 A1 | 3/2018 | Chae et al. |
| 2019/0137815 A1* | 5/2019 | Kim .................... H01L 27/3262 |
| 2019/0212610 A1 | 7/2019 | Kim et al. |
| 2019/0305051 A1* | 10/2019 | Takahashi ........... H01L 51/5253 |
| 2020/0089047 A1* | 3/2020 | Baek ................. G02F 1/133512 |

* cited by examiner

COLOR CONTROL MEMBER AND DISPLAY DEVICE EMPLOYING THE SAME

CROSS-REFERENCE TO RELATED APPLICATION

This application claims the benefit of Korean Patent Application No. 10-2019-0047520, filed on Apr. 23, 2019 in the Korean Intellectual Property Office, the disclosure of which is incorporated herein in its entirety by reference.

BACKGROUND

1. Field

One or more embodiments relate to a color control member and a display device employing the same, and more specifically, to such a color control member enabling prevention of color mixing between pixel areas of the display device, as well as optimization of transmission of light from the pixel areas.

2. Description of the Related Art

As the demand for a display device increases, the necessity for a display device that may be used for various purposes increases. With this trend, a display device is gradually becoming large and slim in its thickness with such dimensioning, the display of an accurate and clear color of an image becomes increasingly important and desirable.

SUMMARY

One or more embodiments include a display device having improved color reproduction and improved light efficiency. However, it should be understood that embodiments described herein should be considered in a descriptive sense only and not as limiting of the disclosure.

According to one or more embodiments, a color control member may include a substrate including a plurality of pixel areas including a first pixel area and a second pixel area; a first color conversion layer converting incident light on the first color conversion layer to light of a first color, the light of the first color being emitted from the first color conversion layer and through the first pixel area; a second color conversion layer converting incident light on the second color conversion layer to light of a second color, the light of the second color being emitted through the second color conversion layer and through the second pixel area; and a partition wall disposed in a light-blocking area of the substrate, between the first color conversion layer and the second color conversion layer and defining an air gap locating to correspond to the light-blocking area of the substrate.

The partition wall may further include an interface layer including a first portion and a second portion, the first portion being inclined with respect to the substrate by a predetermined angle, and the second portion being connected to the first portion, and spaced apart from the substrate by a predetermined interval in a vertical direction.

The interface layer may further include a third portion disposed in the plurality of pixel areas of the substrate and connected to the first portion opposite the connection of the second portion to the first portion.

The second portion of the interface layer may include a through hole.

The partition wall may further include a reflective layer disposed on at least one of the first portion and the second portion of the interface layer.

The second portion of the interface layer may include a first through hole, and the reflective layer may include a second through hole disposed to overlap the first through hole of the interface layer.

The color control member may further include a light-blocking member disposed between the substrate and the partition wall, and in the air gap.

The color control member may further include a first color filter layer disposed between the substrate and the first color conversion layer and selectively transmitting the light of the first color emitted from the first color conversion layer; and a second color filter layer disposed between the substrate and the second color conversion layer and selectively transmitting the light of the second color emitted from the second color conversion layer.

The color control member may further include a transmission layer disposed on a third pixel area apart from the first pixel area and the second pixel area and transmitting the incident light thereon.

The partition wall may be disposed between the transmission layer and the first color conversion layer, and between the transmission layer and the second color conversion layer.

According to one or more embodiments, a display device may include a first substrate including a plurality of pixel areas including a first pixel area and a second pixel area; a first color conversion layer converting incident light on the first color conversion layer to light of a first color, the light of the first color being emitted from the first color conversion layer and through the first pixel area; a second color conversion layer converting incident light on the second color conversion layer to light of a second color, the light of the second color being emitted from the second color conversion layer and through the second pixel area; a partition wall disposed in a light-blocking area of the substrate, between the first color conversion layer and the second color conversion layer and defining an air gap locating to correspond to the light-blocking area of the first substrate; a second substrate facing the first substrate; and a plurality of display elements disposed on the second substrate and including a first display element and a second display element emitting the incident light respectively on the first color conversion layer and the second color conversion layer.

The partition wall may include an interface layer including a first portion and a second portion, the first portion being inclined with respect to the first substrate by a predetermined angle, and the second portion being connected to the first portion, and spaced apart from the first substrate by a predetermined interval in a vertical direction.

The interface layer may further include a third portion disposed in the plurality of pixel areas of the first substrate and connected to the first portion opposite the connection of the second portion to the first portion.

The second portion of the interface layer may include a through hole.

The partition wall may further include a reflective layer disposed on at least one of the first portion and the second portion of the interface layer.

The second portion of the interface layer may include a first through hole, and the reflective layer may include a second through hole disposed to overlap the first through hole of the interface layer.

The display device may further include a light-blocking member disposed between the first substrate and the partition wall, and in the air gap.

The display device may further include a first color filter layer disposed on the first color conversion layer and selectively transmitting the light of the first color emitted from the first color conversion layer; and a second color filter layer disposed on the second color conversion layer and selectively transmitting the light of the second color emitted from the second color conversion layer.

According to one or more embodiments, a display device may include a substrate; a first display element and a second display element disposed on the first substrate, and each emitting light; a pixel-defining layer disposed on the substrate, and around the first display element and the second display element; a first color conversion layer disposed on the first display element, and converting light emitted from the first display element to light of a first color, the light of the first color being emitted from the first color conversion layer; a second color conversion layer disposed on the second display element, and converting light emitted from the second display element to light of a second color, the light of the second color being emitted from the second color conversion layer; and a partition wall disposed on the pixel-defining layer, between the first color conversion layer and the second color conversion layer, and defining an air gap locating on the pixel-defining layer.

The partition wall may include an interface layer including a first portion and a second portion, the first portion being inclined with respect to the second substrate by a predetermined angle, and the second portion being connected to the first portion, and spaced apart from the substrate by a predetermined interval in a vertical direction.

The interface layer may further include a third portion disposed on at least one of the first display element and the second the display element, and connected to the first portion opposite the connection of the second portion to the first portion.

The second portion of the interface layer may include a through hole.

The partition wall may further include a reflective layer disposed on at least one of the first portion and the second portion of the interface layer.

The second portion of the interface layer may include a first through hole, and the reflective layer may include a second through hole disposed to overlap the first through hole of the interface layer.

The display device may further include a first color filter layer disposed on the first color conversion layer and selectively transmitting the light of the first color emitted from the first color conversion layer; and a second color filter layer disposed on the second color conversion layer and selectively transmitting the light of the second color emitted from the second color conversion layer.

The display device may further include an encapsulation member disposed between the first display element and the second display element of the plurality of display elements and the first color conversion layer and the second color conversion layer, and to cover at least the first display element and the second display element of the plurality of display elements and the pixel-defining layer; and a light-blocking member disposed between the encapsulation member and the partition wall, and in the air gap.

The display device may further include an encapsulation member disposed to cover the first color filter layer and the second color filter layer; and a light-blocking member disposed on the encapsulation member and to overlap the air gap.

BRIEF DESCRIPTION OF THE DRAWINGS

These and/or other aspects will become apparent and more readily appreciated from the following description of the embodiments, when referenced in view of the accompanying drawings, in which.

DETAILED DESCRIPTION

Figure 1:
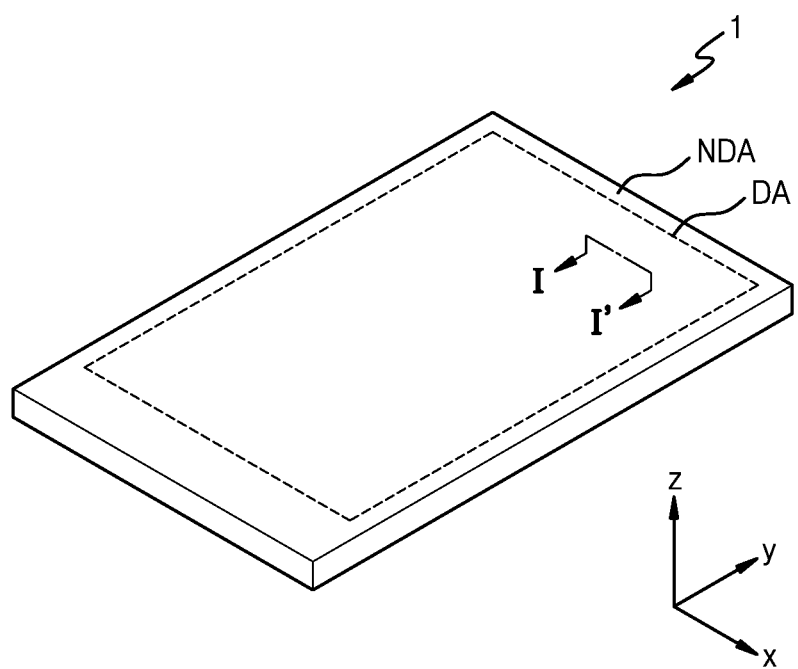
FIG. 1 is a perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Expressions such as "at least one of," when preceding a list of elements, modify the entire list of elements and do not modify the individual elements of the list.

As the disclosure allows for various changes and numerous embodiments, the embodiments may be illustrated in the drawings and described in detail in the written description. Effects and features of the disclosure, and a method of accomplishing the same will be apparent when referring to the following embodiments described in detail, taken in conjunction with the accompanying drawings. However, the disclosure is not limited to the embodiments set forth herein and may be implemented in various forms.

Hereinafter, embodiments of the disclosure are described in detail with reference to the accompanying drawings. For clear description of the disclosure, parts that are not related to the description are omitted. When description is made with reference to the drawings, same reference numerals are used for the same or corresponding elements and repeated description thereof is omitted.

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. For example, since a size and a thickness of each element shown in the drawings have been arbitrarily selected for convenience of description, the disclosure is not limited to the shown configuration.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

When a certain embodiment may be implemented differently, a specific process order may be performed differently from the described order. For example, two consecutively described processes may be performed substantially at the same time or performed in an order opposite to the described order.

It will be understood that although the terms "first", "second", etc. may be used herein to describe various components, these components should not be limited by these terms. These terms are only used to distinguish one component from another. As used herein, the singular forms "a" "an" and "the" are intended to include the plural forms as well, unless the context clearly indicates otherwise. It will be understood that when a certain element "comprises" another element, it does not exclude another element unless indicated otherwise and it may further include the other element.

It will be understood that the term "on a plan view" specifies when an object part is viewed from above, and the term "on a schematic cross-sectional view" specifies when a vertical cross-section of an object part is viewed from a lateral side. It will be understood that the term "overlap" includes overlap on a plan view and overlap on a cross-sectional view. Also, it will be understood that the term "overlap" or "overlapped" means that a first object may be above or below or to a side of a second object, and vice versa.

FIG. 1 is a perspective view of a display device 1 according to an embodiment.

Referring to FIG. 1, the display device 1 according to an embodiment may include a display area DA and a non-display area NDA. The non-display area NDA may be arranged outside the display area DA to surround the display area DA. Various wirings and a driving circuit unit may be located in the non-display area NDA, the various wirings and the driving circuit unit transferring an electric signal to the display area DA. The display device 1 may display a predetermined image by using light emitted from a plurality of pixels arranged in the display area DA. Though not shown, the display device 1 may include a bending area in a partial area of the non-display area NDA, the bending area being bent.

The display device 1 may include a quantum dot light-emitting display. The display device 1 may be implemented as various kinds of electronic devices such as mobile phones, notebook computers, and smartwatches.

Figure 2:
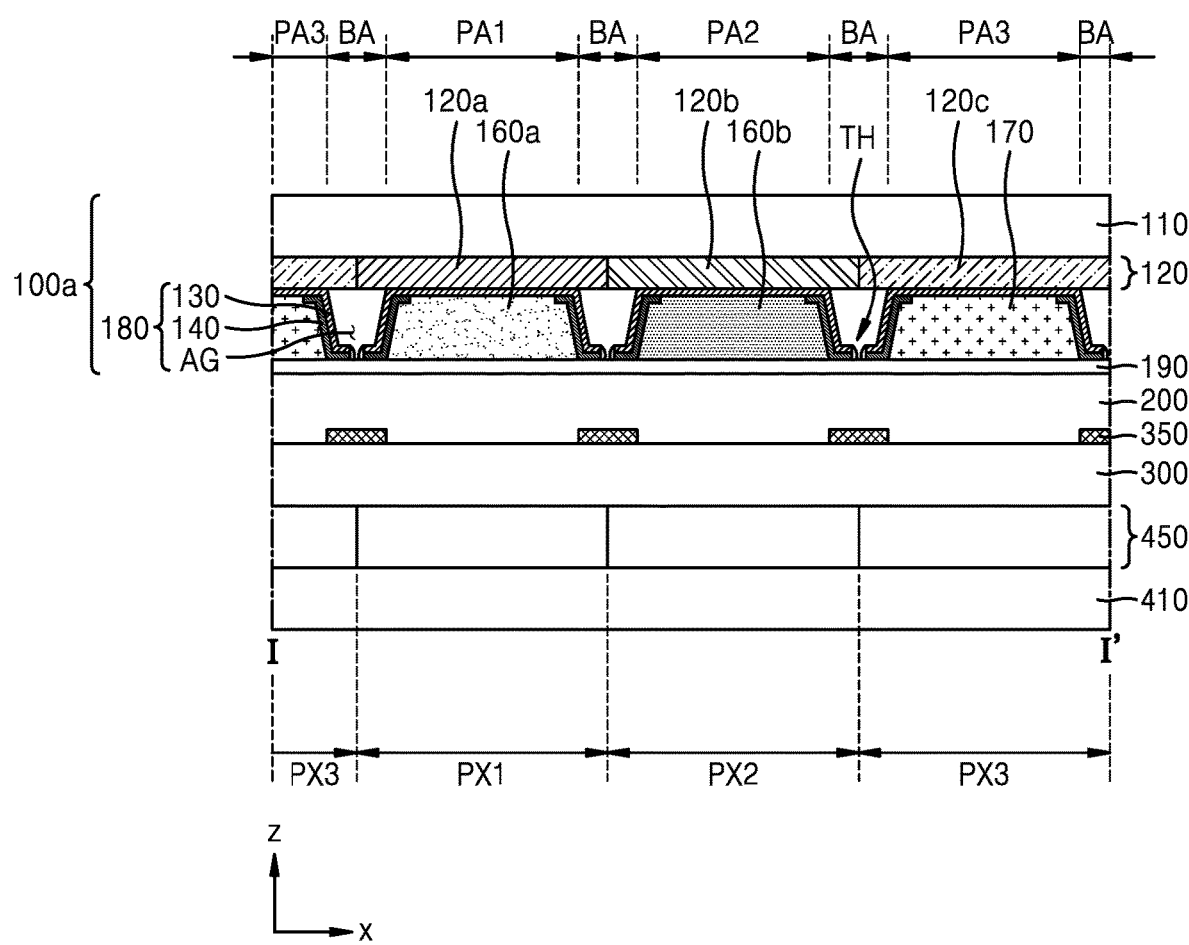
FIG. 2 is a schematic cross-sectional view of the display device taken along line I-I' of FIG. 1 according to an embodiment.
Figure 3A:
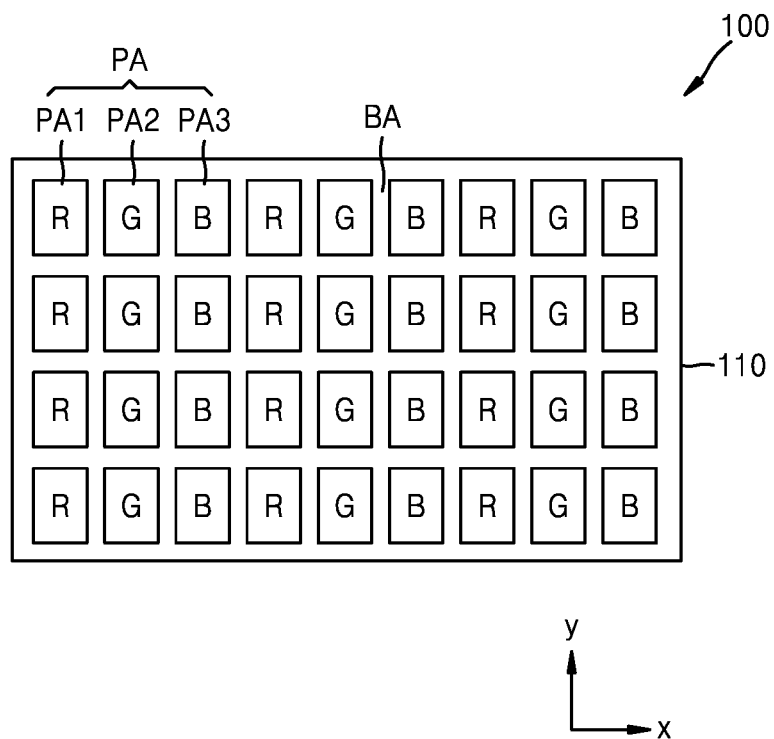
FIG. 3A is a plan view of a color control member of FIG. 2.
Figure 3B:
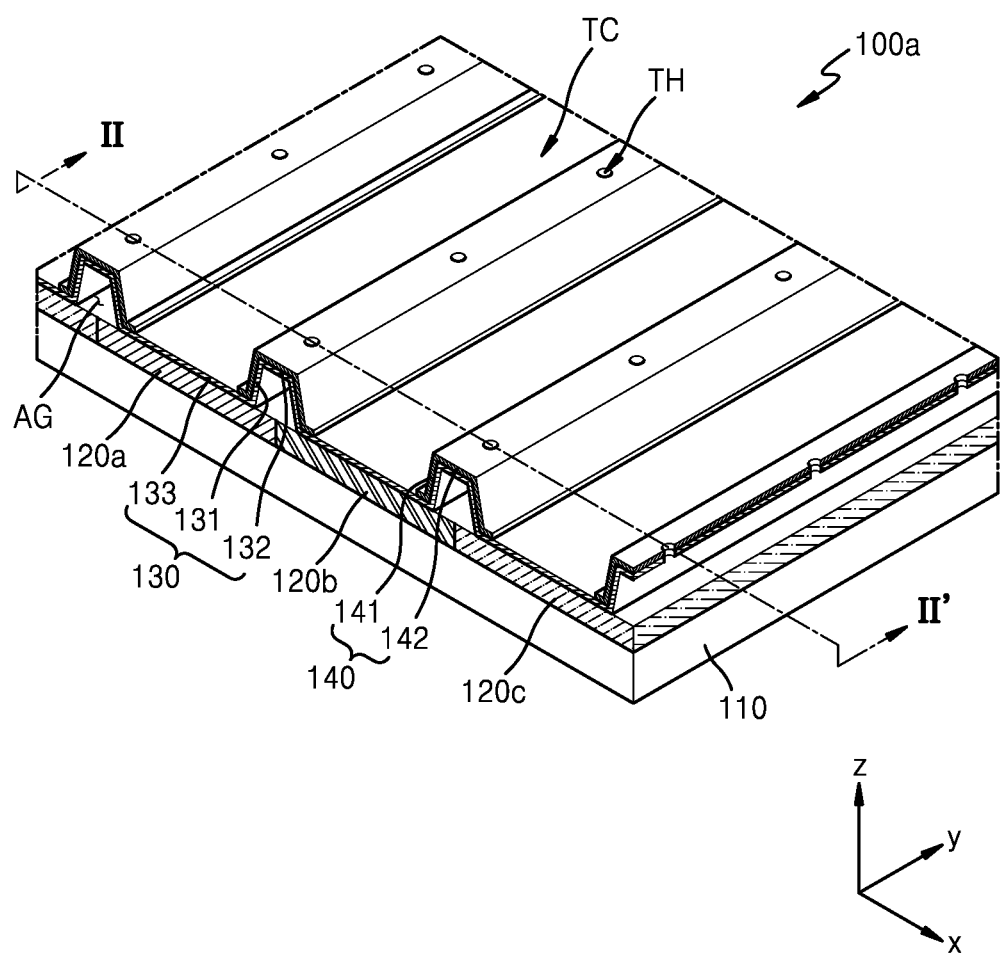
FIG. 3B is a perspective view of a portion of the color control member of FIG. 3A.
Figure 3C:
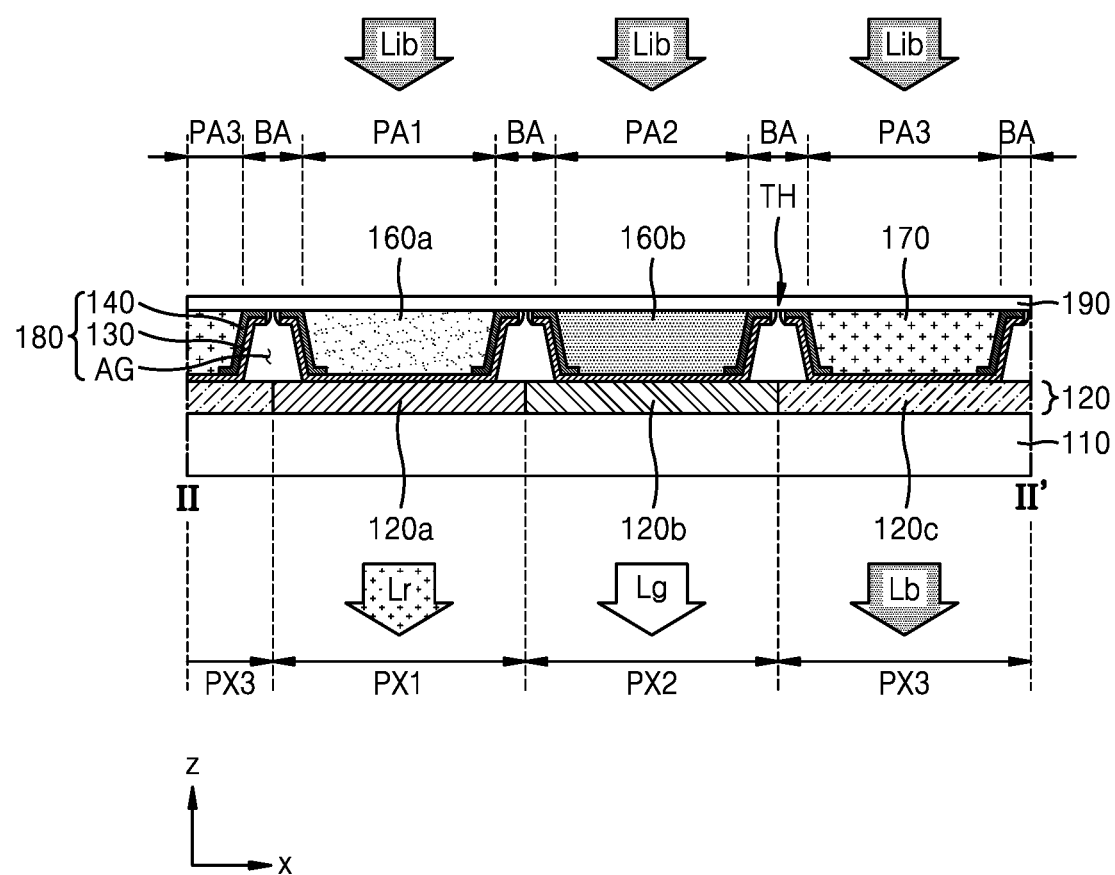
FIG. 3C is a schematic cross-sectional view of the display device taken along line II-II' of FIG. 3B.

FIG. 2 is a schematic cross-sectional view of the display device 1 taken along line I-I' of FIG. 1 according to an embodiment. FIG. 3A is a plan view of a color control member of FIG. 2, FIG. 3B is a perspective view of a portion of the color control member of FIG. 3A, and FIG. 3C is a schematic cross-sectional view of the display device 1 taken along line II-II' of FIG. 3B.

Referring to FIG. 2, the display device 1 may include a substrate 410, an encapsulation member 300, and a color control member 100a that are sequentially stacked in a third direction (i.e., a z-direction), the encapsulation member 300 sealing the substrate 410, and the color control member 100a being over the encapsulation member 300.

A substrate 110 of the color control member 100a may include a pixel area PA and a light-blocking area BA that corresponds to an effect of a partition wall and/or a light blocking member discussed below. The pixel area PA emits light and may be surrounded by the light-blocking area BA. The pixel area PA may be divided into a first pixel area PA1, a second pixel area PA2, and a third pixel area PA3 depending on a color of emitted light. For example, the first pixel area PA1 may be an area that emits light Lr of a first color, the second pixel area PA2 may be an area that emits light Lg of a second color, and the third pixel area PA3 is an area that emits light Lb of a third color. The light-blocking area BA may be an area that does not emit light and may be arranged in a mesh configuration between the first to third pixel areas PA1, PA2, and PA3.

A pixel layer 450 may be arranged on the substrate 410. A display element that emits light may be arranged in the pixel layer 450, the display element corresponding to the pixel area PA of the color control member 100a. The encapsulation member 300 may be arranged on the pixel layer 450.

The color control member 100a may be formed separately from the pixel layer 450 on the substrate 410 and then coupled to the substrate 410. A filling layer 200 may be arranged between the color control member 100a and the encapsulation member 300. A light-blocking member 350 may be further arranged between the encapsulation member 300 and the filling layer 200. The light-blocking member 350 may be disposed to correspond to the light-blocking area BA of the color control member 100a. The light-blocking member 350 may have various colors including black or white. In the case where the light-blocking member 350 is black, the light-blocking member 350 may include a black matrix. In the case where the light-blocking member 350 is white, the light-blocking member 350 may include an organic insulating material such as a white resin. The light-blocking member 350 may include an opaque inorganic insulating material such as $CrO_x$ or $MoO_x$, or include an opaque organic insulating material such as a black resin.

The light-blocking member 350 may prevent a portion of light emitted from a display element from being incident to a color conversion layer or a transmission layer of a neighboring pixel area. Therefore, according to an embodiment, since color mixing between pixel areas is prevented, color coincidence and color reproduction are improved and light efficiency is improved, and thus, power consumption may be reduced.

The color control member 100a is described with reference to FIGS. 3A to 3C. The color control member 100a may receive incident light Lib and emit light Lr of the first color, light Lg of the second color, light Lb of the third color. The color control member 100a may include the substrate 110, a color filter layer 120, a first color conversion layer 160a, and a second color conversion layer 160b.

The substrate 110 may include the first pixel area PA1 and the second pixel area PA2 that are apart from each other, and the light-blocking area BA between the first pixel area PA1 and the second pixel area PA2. The first color conversion layer 160a may be arranged in the first pixel area PA1 and convert incident light Lib to light Lr of the first color. The second color conversion layer 160b may be arranged in the second pixel area PA2 and convert incident light Lib to light Lg of the second color.

The color control member 100a may further include a transmission layer 170. The substrate 110 may further include a third pixel area PA3 that is apart from the first pixel area PA1 and the second pixel area PA2. The transmission layer 170 may be arranged in the third pixel area PA3 and may transmit the incident light Lib.

The arrangement of the respective pixel areas PA1, PA2, and PA3 shown in FIG. 3A is provided as an example and the embodiment is not limited thereto. The first to third pixel areas PA1, PA2, and PA3 may be arranged in various configurations, the first to third pixel areas PA1, PA2, and PA3 corresponding to the arrangement of pixels of the display device 1.

The light Lr of the first color may be red light, the light Lg of the second color may be green light, and the light Lb of the third color may be blue light. The red light may be light having a peak wavelength of about 580 nm or more and less than about 750 nm. The green light may be light having a peak wavelength of about 495 nm or more and less than about 580 nm. The blue light may be light having a peak wavelength of about 400 nm or more and less than about 495 nm. The incident light Lib may be light of the third color.

The substrate 110 may be a transparent substrate in which the light Lr and the light Lg respectively of the first color and the second color may be emitted through the first pixel area PA1 and the second pixel area PA2, the light Lr and the light Lg being respectively emitted from the first color conversion layer 160a and the second color conversion layer 160b. The light Lb of the third color may be emitted through the third pixel area PA3 of the substrate 110.

One or more properties of the substrate 110 may not be particularly limited. For example, the substrate 110 may include an insulating material such as glass, plastic, and crystal. The substrate 110 may be selected by taking into account mechanical strength, thermal stability, transparency, surface flatness, handling convenience, a waterproofing property, etc.

The color filter layer 120 may include an organic material pattern including dye or pigment. The color filter layer 120 may include a first color filter layer 120a, a second color filter layer 120b, and a third color filter layer 120c. The first color filter layer 120a may be arranged in at least the first pixel area PA1, the second color filter layer 120b may be arranged in at least the second pixel area PA2, and the third color filter layer 120c may be arranged in at least the third pixel area PA3. The first color filter layer 120a may selectively transmit only light of the first color, the second color filter layer 120b may selectively transmit only light of the second color, and the third color filter layer 120c may selectively transmit only light of the third color.

The first color conversion layer 160a, the second color conversion layer 160b, and the transmission layer 170 each may be formed in a concave space delimited by a partition wall 180 by using an inkjet method.

The first color conversion layer 160a overlaps the first color filter layer 120a in the first pixel area PA1, converts the incident light Lib to the light Lr of the first color, and emits the light Lr toward the substrate 110. The first color conversion layer 160a may include first quantum dots, the first quantum dots being excited by the incident light Lib and emitting the light Lr of the first color having a wavelength greater than a wavelength of the incident light Lib.

The second color conversion layer 160b may overlap the second color filter layer 120b in the second pixel area PA2, convert the incident light Lib to the light Lg of the second color, and emit the light Lg toward the substrate 110. The second color conversion layer 160b may include second quantum dots, the second quantum dots being excited by the incident light Lib and emitting the light Lg of the second color having a wavelength greater than a wavelength of the incident light Lib.

The transmission layer 170 may overlap the third color filter layer 120c in the third pixel area PA3, transmits the light Lb of the third color, and emits the light Lb toward the substrate 110.

The partition wall 180 may be provided at least in the light-blocking area BA. The partition wall 180 may be around a periphery of or surround the first color conversion layer 160a, the second color conversion layer 160b, and the transmission layer 170. The partition wall 180 may be disposed between the first color conversion layer 160a, the second color conversion layer 160b, and the transmission layer 170. The partition wall 180 may include an interface layer 130 and an air gap AG is defined by the partition wall 180. The air gap may be a cavity. The air gap AG may be covered or surrounded by an interface layer 130. The air gap may be formed in the partition wall 180 as an inner cavity. The partition wall 180 may be delimited by the interface layer 130. The partition wall 180 may have a trapezoidal shape in a cross-section view. The partition wall 180 may be tapered off in the z-direction. The partition wall 180 may have a forward tapered shape in cross-section view such that a width of the partition wall 180 decreases as being away from the substrate 110. For example, the partition wall 180 may be formed as opposing portions of the interface layer 130 that are disposed between neighboring first and second color conversion layers 160a and 160b.

The interface layer 130 may provide a support structure for forming the partition wall 180 and may form a lateral surface and a top surface of the partition wall 180 to delimit the partition wall 180. The interface layer 130 may include a first portion 131 and a second portion 132, the first portion 131 being the lateral surface of the partition wall 180, and the second portion 132 being the top surface of the partition wall 180. The first portion 131 may have a shape inclined with respect to the substrate 110 by a predetermined angle. The first portion 131 may have a shape in cross-section view of an inverse taper having a width increasing away from the substrate 110. An angle between the first portion 131 and the substrate 110 may be less than about 90°. The first portion 131 may be disposed in the light-blocking area BA, and between the first color conversion layer 160a and the second color conversion layer 160b, between the second color conversion layer 160b and the transmission layer 170 and between the transmission layer 170 and the first color conversion layer 160a. The air gap AG is formed between a pair of the first portions 131 facing each other in the light-blocking area BA. The second portion 132 may be disposed in the light-blocking area BA and be spaced apart by a predetermined interval in the third direction (i.e., the z-direction) from the substrate 110. The second portion 132 may extend from a side of the first portion 131 that is away from the substrate 110 and may be connected to the first portion 131. The second portion 132 may include a through hole TH.

The interface layer 130 may further include a third portion 133 arranged in the pixel area PA. The third portion 133 may be disposed between the color filter layer 120 and the first color conversion layer 160a, between the color filter layer 120 and the second color conversion layer 160b, and between the color filter layer 120 and the transmission layer 170. The first portion 131 may connect the second portion 132 to the third portion 133. The first to third portions 131, 132, and 133 may continuously extend to constitute the interface layer 130.

The interface layer 130 may include a single inorganic layer including an inorganic material such as silicon nitride ($SiN_x$) and/or silicon oxide ($SiO_x$).

The partition wall 180 may further include a reflective layer 140. The reflective layer 140 may be provided on the interface layer 130. The reflective layer 140 may prevent color light emitted from the display element 430 from being incident to a color conversion layer or a transmission layer of a neighbor pixel area. The reflective layer 140 may prevent the light Lr of the first color emitted from the first color conversion layer 160a from being irradiated to the second color conversion layer 160b or the transmission layer 170, prevent the light Lg of the second color emitted from the second color conversion layer 160b from being irradiated to the first color conversion layer 160a or the transmission layer 170, or prevent the light Lb of the third color emitted from the transmission layer 170 from being irradiated to the first color conversion layer 160a or the second color conversion layer 160b.

The reflective layer 140 may include a single metal layer including a metal having a high light reflectivity. The metal layer may include at least one of Ag, Mg, Al, Pt, Pd, Au, Ni, Nd, Ir, Cr, an alloy thereof, and a compound thereof. For example, the reflective layer 140 may include Ag. In another embodiment, the reflective layer 140 may have a multi-layered structure in which a plurality of layers are stacked in succession. At least one of the layers stacked in succession may include a metal layer. For example, the reflective layer 140 may include a metal oxide layer and a metal layer that are stacked in succession. The metal oxide layer may include $AlO_x$, $CrO_x$, $MoO_x$, $Ti_x$, $AlNdO_x$, $CuMoO_x$, $MoTaO_x$, and $MoTi_x$.

The reflective layer 140 may include a first portion 141 and a second portion 142, the first portion 141 being provided on the first portion 131 of the interface layer 130, and the second portion 142 being provided on the second portion 132 of the interface layer 130. That is, the first portion 141 may have a shape inclined with respect to the substrate 110 by a predetermined angle. The first portion 141 may have a shape in a cross-section view of an inverse taper having a width increasing away from the substrate 110. The second portion 142 may be located in the light-blocking area BA and may be apart in the third direction (i.e., the z-direction) from the substrate 110 by a predetermined interval. The second portion 142 may extend from a side of the first portion 141 that is away from the substrate 110 and may be connected to the first portion 141. The second portion 142 may include a through hole TH. The through hole TH of the reflective layer 140 may overlap the through hole TH of the interface layer 130. The through hole TH of the interface layer 130 and the through hole TH of the reflective layer 140 may be provided as holes having a predetermined interval with respect to each other. A portion of the first portion 141 of the reflective layer 140 may extend on the third portion 133 of the interface layer 130. In another embodiment, the first portion 141 of the reflective layer 140 may not extend on the third portion 133 of the interface layer 130.

FIG. 3B shows the partition wall 180 between pixel areas different from each other (e.g. pixel areas in a first direction (an x-direction) in FIG. 3A), the through hole TH of the interface layer 130, and the through hole TH of the reflective layer 140. Though not shown, a partition wall between the same pixel areas (e.g. pixel areas in a second direction (i.e., a y-direction) in FIG. 3A), an interface layer, and a reflective layer may also have the same configurations as those of the partition wall 180, the interface layer 130, and the reflective layer 140 described above.

The first color conversion layer 160a, the second color conversion layer 160b, and the transmission layer 170 may be formed inside a trench TC, which is a concave space defined by the partition wall 180.

The color control member 100a may further include a planarization layer 190 arranged on the first color conversion layer 160a, the second color conversion layer 160b, and the transmission layer 170 and providing a flat top surface. The planarization layer 190 may be arranged over the substrate 110 so as to cover the first color conversion layer 160a, the second color conversion layer 160b, and the transmission layer 170. The planarization layer 190 may be transparent such that pieces of incident light Lib are irradiated to the first color conversion layer 160a, the second color conversion layer 160b, and the transmission layer 170. The planarization layer 190 may include a single layer or a multi-layer including an inorganic material such as silicon nitride ($SiN_x$) and/or silicon oxide ($SiO_x$). In another embodiment, the planarization layer 190 may include a transparent organic material such as a polyimide resin, an acrylic resin, and a resist material. The planarization layer 190 may be formed by a wet process such as a slit coating method and a spin coating method, and a dry process such as chemical vapor deposition and vacuum deposition. Other materials and the forming methods may also be implemented. The planarization layer 190 may be omitted.

Figure 4:
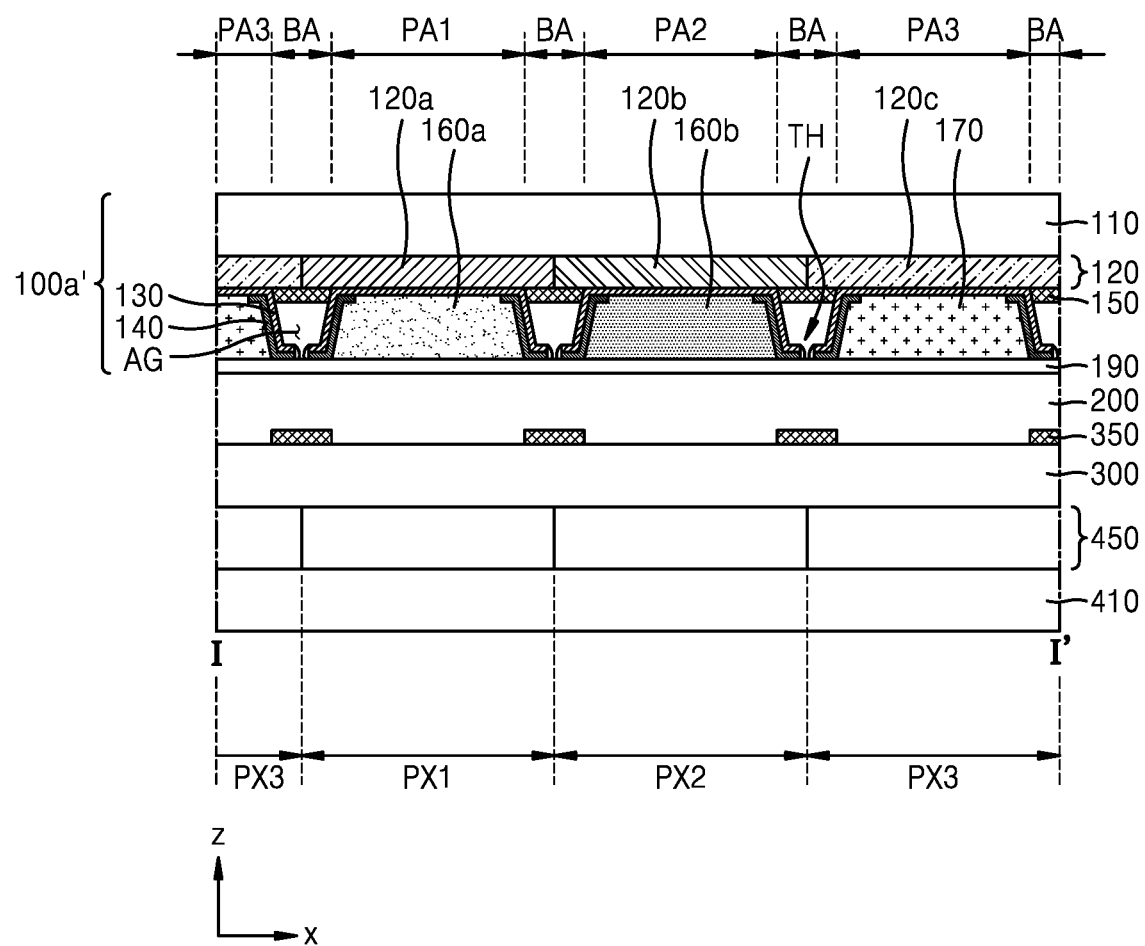
FIG. 4 is a schematic cross-sectional view of a color control member taken along line I-I' of FIG. 1 according to another embodiment.
Figure 5A:
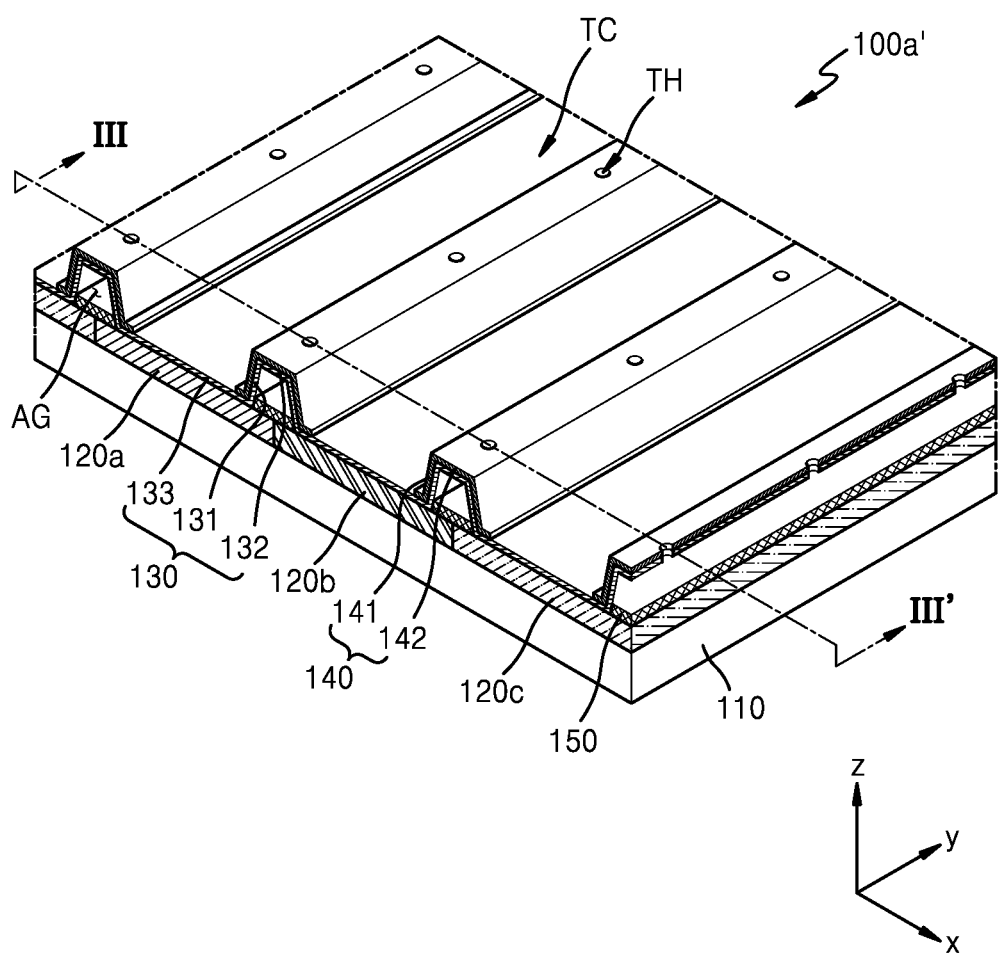
FIG. 5A is a perspective view of a portion of the color control member of FIG. 4.

FIG. 4 is a schematic cross-sectional view of a color control member 100a' taken along line I-I' of FIG. 1 according to another embodiment. FIG. 5A is a perspective view of a portion of the color control member 100a' of FIG. 4, and FIG. 5B is a schematic cross-sectional view of the color control member 100a' taken along line of FIG. 5A.

The color control member 100a' according to the embodiment shown in FIG. 4 is different from the color control member 100a shown in FIG. 2 in that the color control member 100a' further includes a light-blocking member 150.

Figure 5B:
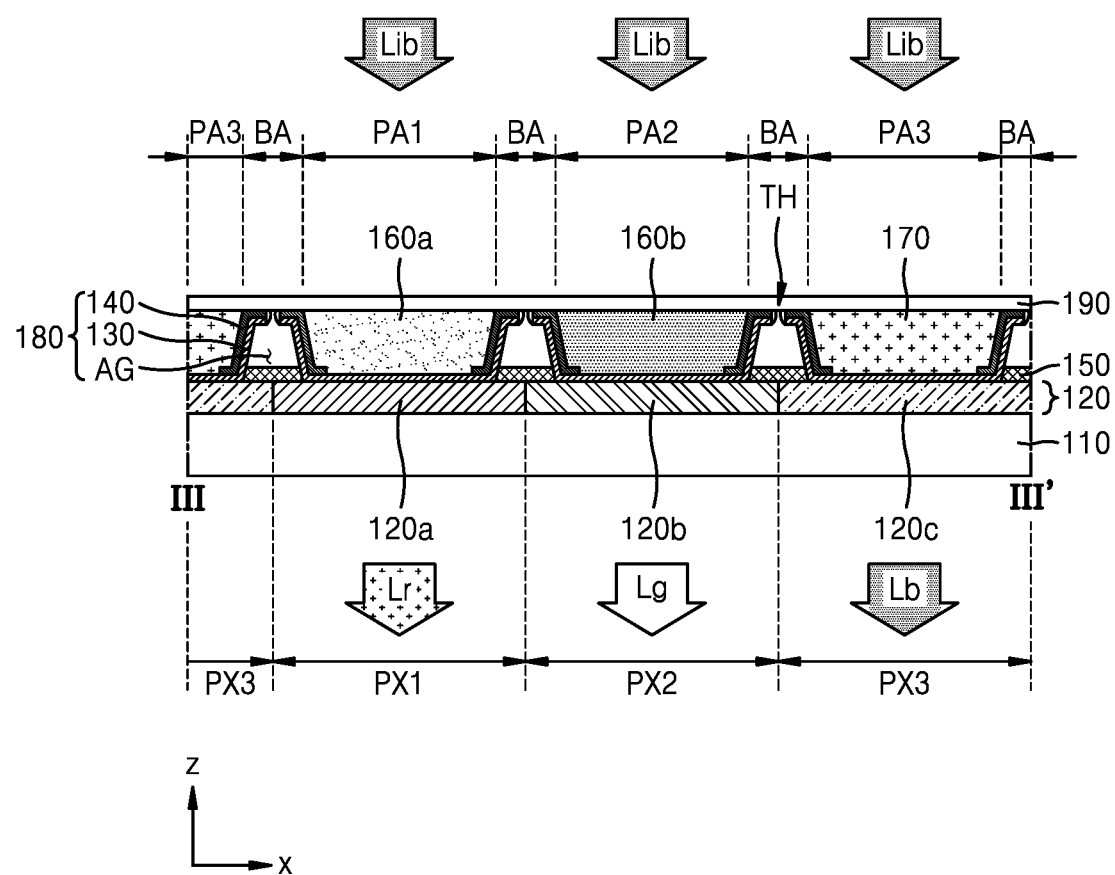
FIG. 5B is a schematic cross-sectional view of the color control member taken along line III-III' of FIG. 5A.

Referring to FIGS. 4, 5A, and 5B, the color control member 100a' may further include the light-blocking member 150 inside the air gap AG. The light-blocking member 150 may be arranged in the light-blocking area BA and arranged between the interface layer 130 and the substrate 110, that is, between the interface layer 130 and the color filter layer 120. The light-blocking member 150 may directly contact the color filter layer 120.

When light is emitted through the light-blocking area BA, light leakage may occur in the display device 1. The light-blocking member 150 may prevent light from being emitted to the outside through the light-blocking area BA and thus prevent light leakage from occurring. The light-blocking member 150 may have various colors including black or white. In the case where the light-blocking member 150 is black, the light-blocking member 150 may include a black matrix. In the case where the light-blocking member 150 is white, the light-blocking member 150 may include an organic insulating material such as a white resin. The light-blocking member 150 may include an opaque inorganic insulating material such as $CrO_x$ or $MoO_x$, or include an opaque organic insulating material such as a black resin.

Figure 6:
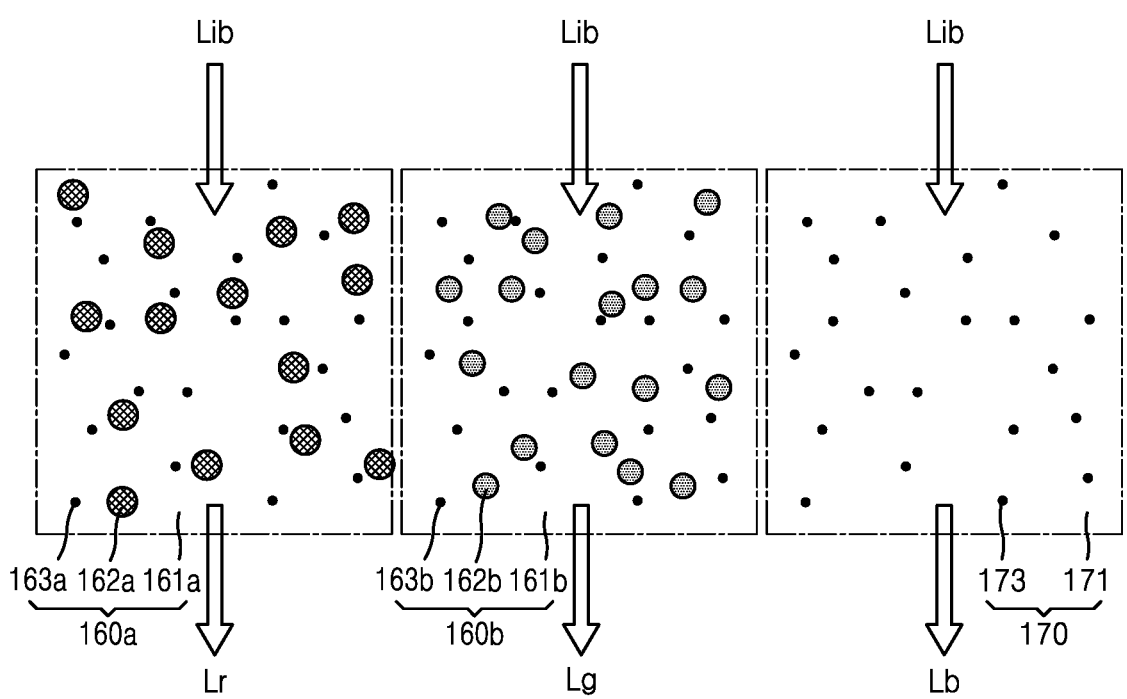
FIG. 6 is an enlarged schematic cross-sectional view of a first color conversion layer and a second color conversion layer and a transmission layer of a color control member according to an embodiment.

FIG. 6 is an enlarged cross-sectional view of the first color conversion layer 160a, the second color conversion layer 160b, and the transmission layer 170 of a color control member according to an embodiment.

Referring to FIG. 6, the first color conversion layer 160a may convert blue incident light Lib to light Lr of the first color. The first color conversion layer 160a may include a first photosensitive polymer 161a in which first quantum dots 162a and first scattering particles 163a are dispersed.

The first quantum dots 162a may be excited by the blue incident light Lib and may emit light Lr of the first color having a wavelength greater than a wavelength of blue light in an isotropic way. The first photosensitive polymer 161a may include an organic material having a light transmissive property. The first scattering particles 163a may scatter the blue incident light Lib that is not absorbed by the first quantum dots 162a and allow more first quantum dots 162a to be excited, thereby increasing a color conversion efficiency of the first color conversion layer 160a. The first scattering particles 163a may include, for example, titanium oxide ($TiO_2$) or a metal particle. A core of the first quantum dots 162a may include a Groups II-VI compound, a Groups III-V compound, a Groups IV-VI compound, a Group IV element, a Group IV compound, or a combination thereof.

The second color conversion layer 160b may convert the blue incident light Lib to light Lg of the second color. The second color conversion layer 160b may include a second photosensitive polymer 161b in which second quantum dots 162b and second scattering particles 163b are dispersed.

The second quantum dots 162b may be excited by the blue incident light Lib and may emit light Lg of the second color having a wavelength greater than a wavelength of blue light in an isotropic way. The second photosensitive polymer 161b may include an organic material having a light transmissive property and include the same material as that of the first photosensitive polymer 161a. The second scattering particles 163b may scatter the blue incident light Lib that is not absorbed by the second quantum dots 162b and allow more second quantum dots 162b to be excited, thereby increasing a color conversion efficiency of the second color conversion layer 160b. The second scattering particles 163b may include, for example, titanium oxide ($TiO_2$) or a metal particle and include the same material as that of the first scattering particles. A core of the second quantum dots 162b may include a Groups II-VI compound, a Groups III-V compound, a Groups IV-VI compound, a Group IV element, a Group IV compound, or a combination thereof. The second quantum dots 162b may include the same material as that of the first quantum dots 162a. In this case, a size of the second quantum dots 162b may be less than a size of the first quantum dots 162a.

The transmission layer 170 may transmit the blue incident light Lib and emit the blue incident light Lib to a direction of the substrate 110. The transmission layer 170 may include a third photosensitive polymer 171 in which third scattering particles 173 are dispersed. The third photosensitive polymer 171 may include an organic material having a light transmissive property, for example, a silicon resin and an epoxy resin, and include the same material as that of the first photosensitive polymer 161a and the second photosensitive polymer 161b. The third scattering particles 173 may scatter the blue incident light Lib and emit the blue incident light Lib and may include the same material as that of the first scattering particles 163a and the second scattering particles 163b.

The Groups II-VI compound may include one of: a two-element compound including CdSe, CdTe, ZnS, ZnSe, ZnTe, ZnO, HgS, HgSe, HgTe, MgSe, MgS, and a mixture thereof; a three-element compound including AgInS, CuInS, CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Groups III-V compound may include one of: a two-element compound including GaN, GaP, GaAs, GaSb, AlN, AlP, AlAs, AlSb, InN, InP, InAs, InSb, and a mixture thereof; a three-element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Groups IV-VI compound may include one of: a two-element compound including SnS, SnSe, SnTe, PbS, PbSe, PbTe, and a mixture thereof; a three-element compound including SnSeS, SnSeTe, SnSTe, PbSeS, PbSeTe, PbSTe, SnPbS, SnPbSe, SnPbTe, and a mixture thereof; and a four-element compound including SnPbSSe, SnPbSeTe, SnPbSTe, and a mixture thereof. The Group IV element may include one of Si, Ge, and a mixture thereof. The Group IV compound may include a two-element compound including one of SiC, SiGe, and a mixture thereof.

The two-element compound, the three-element compound, or the four-element compound may be inside a particle at a uniform concentration or may be divided into states in which concentration distributions thereof are partially different and exist inside the same particle. Also, the quantum dot may include a core/shell structure in which one quantum dot surrounds another quantum dot. An interface between the core and the shell may have a concentration gradient in which the concentration of an element in the shell is reduced toward a center thereof.

In an embodiment, the quantum dot may include a core-shell structure including the core including a nano crystal, and the shell surrounding the core. The shell of the quantum dot may serve as a protective layer for maintaining a semiconductor characteristic by preventing chemical denaturalization of the core and/or serve as a charging layer for giving an electrophoretic characteristic to the quantum dot. The shell may have a single layer or a multi-layer. An interface between the core and the shell may have a concentration gradient in which the concentration of an element in the shell is reduced toward a center thereof. Examples of the shell of the quantum dot may include an oxide of a metal or non-metal, a semiconductor compound, or a combination thereof.

For example, though an oxide of the metal or non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a three-element compound such as $MgAl_2O_4$, $CoFe_2O_4$, $NiFe_2O_4$, and $CoMn_2O_4$, the embodiment is not limited thereto.

Also, the semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, the embodiment is not limited thereto.

The quantum dot may have a full width of half maximum (FWHM) of a light-emission wavelength spectrum of about 45 nm or less, preferably about 40 nm or less, more preferably, about 30 nm or less and may improve color saturation or color reproduction in this range. Also, since light emitted through this quantum dot is emitted in all directions, a wide viewing angle may be improved. Also, a shape of a quantum dot may be a shape that is generally used in the relevant field and is not particularly limited. Specifically, as a shape of a quantum dot, a spherical quantum dot, a pyramid-shape quantum dot, a multi-arm-shaped quantum dot, or a cubic nano particle, a nano tube-shaped quantum dot, a nano wire-shaped quantum dot, a nano fiber-shaped quantum dot, and a nano plate-shaped particle may be used. The quantum dot may adjust the color of emitted light depending on a size of a particle thereof. Therefore, the quantum dot may have various light-emitting colors such as blue, red, and green.

Figure 7A:
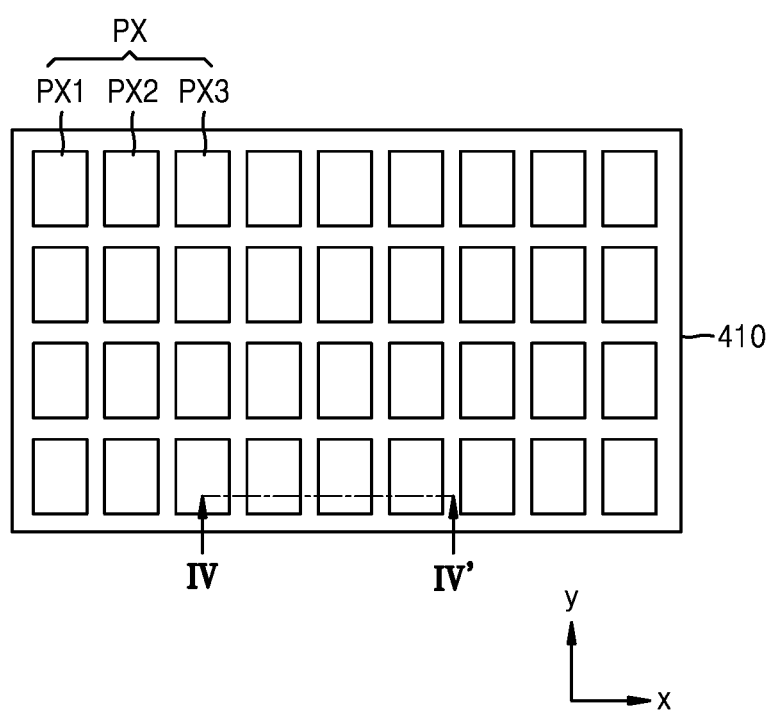
FIG. 7A is a plan view of a portion of a pixel layer of FIG. 2.
Figure 7B:
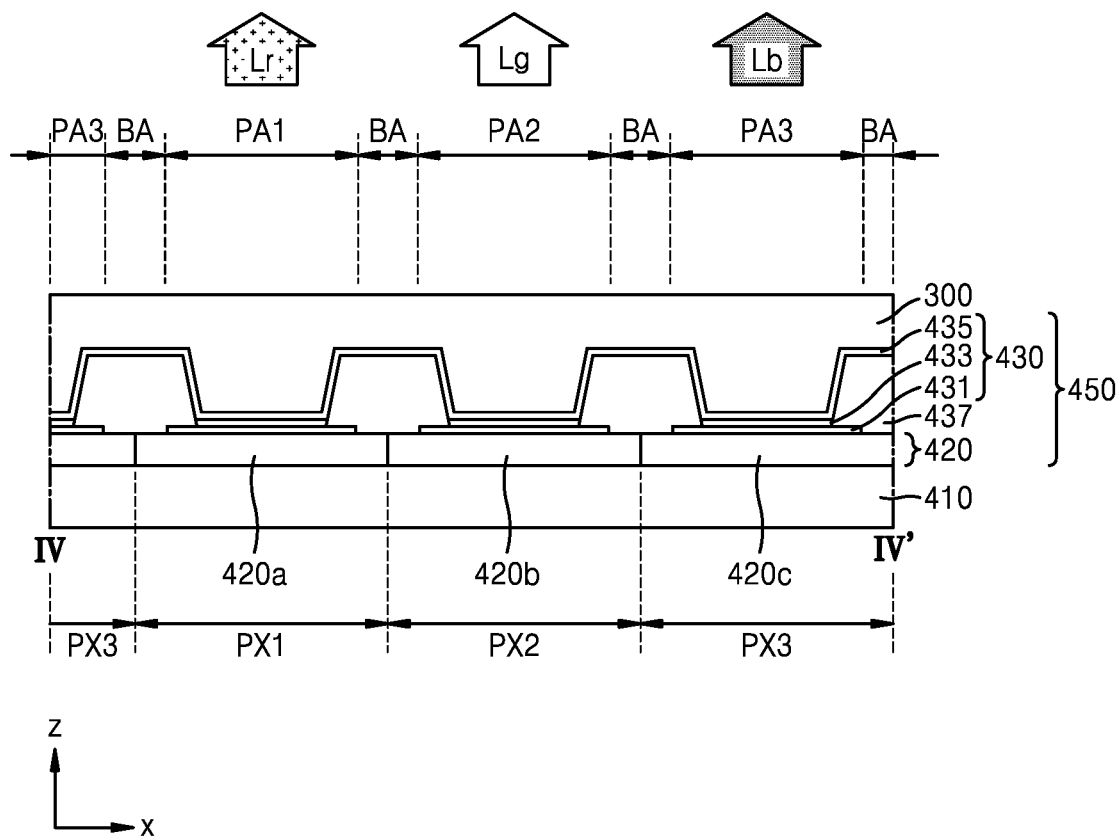
FIG. 7B is a schematic cross-sectional view of the pixel layer taken along line IV-IV' of FIG. 7A.

FIG. 7A is a plan view of a portion of a pixel layer of FIG. 2, and FIG. 7B is a cross-sectional view of the pixel layer taken along line IV-IV' of FIG. 7A. Hereinafter, the pixel layer 450 is described with reference to FIGS. 7A and 7B.

The pixel layer 450 on the substrate 410 may be arranged in the display area DA of the display device 1. A plurality of pixels may be arranged in a predetermined pattern in the pixel layer 450 in the first direction (the x-direction, a row direction) and the second direction (the y-direction, a column direction). The plurality of pixels may include a first pixel PX1, a second pixel PX2, and a third pixel PX3. Sizes or areas of the first pixel PX1, the second pixel PX2, and the third pixel PX3 may be different from each other.

The arrangement of the first pixel PX1, the second pixel PX2, and the third pixel PX3 shown in FIG. 7A is provided as an example and the embodiment is not limited thereto. For example, the first pixel PX1, the second pixel PX2, and the third pixel PX3 may be arranged in a zigzag form.

The substrate 410 may include a material such as a glass material, a metal material, and an organic material. For example, the substrate 410 may include a glass material containing $SiO_2$ as a main component, or include various flexible or bendable materials, for example, a resin such as a reinforced plastic. Though not shown, the substrate 410 may include a bending area in a portion of the non-display area NDA, the substrate 410 being bent.

The first pixel PX1 may include the display element 430 and a first pixel circuit 420a controlling the display element 430. The second pixel PX2 may include the display element 430 and a second pixel circuit 420b controlling the display element 430. The third pixel PX3 may include the display element 430 and a third pixel circuit 420c controlling the display element 430.

The first to third pixel circuits 420a, 420b, and 420c respectively of the first to third pixels PX1, PX2, and PX3 may be arranged in the pixel circuit layer 420. The first to third pixels PX1, PX2, and PX3 each may include a plurality of thin film transistors and at least one capacitor. In addition to the first to third pixel circuits 420a, 420b, and 420c, signal lines and power lines may be arranged in the pixel circuit layer 420, the signal lines and the power lines transferring signals and driving power applied to the first to third pixels PX1, PX2, and PX3. The thin film transistors each may include a semiconductor layer, a gate electrode, a source electrode, and a drain electrode. The semiconductor layer may include amorphous silicon or polycrystalline silicon. The semiconductor layer may include an oxide semiconductor. The semiconductor layer may include a source region, a drain region, and a channel region therebetween. The display element 430 may be provided on the pixel circuit layer 420.

The display element 430 may include an organic light-emitting diode OLED. The display element 430 may emit light of a third color, for example, blue light Lb, the light having an amount of light controlled by the first to third pixel circuits 420a, 420b, and 420c. The first to third pixel circuits 420a, 420b, and 420c each may be arranged in the pixel circuit layer 420, which is a lower layer under the display element 430, and may or may not partially overlap the display element 430.

The display element 430 may be arranged to correspond to the pixel area PA of the color control member 100a or 100a'. The display element 430 of the first pixel PX1 may be arranged to correspond to the first pixel area PA1 of the color control member 100a or 100a'. The display element 430 of the second pixel PX2 may be arranged to correspond to the second pixel area PA2 of the color control member 100a or 100a'. The display element 430 of the third pixel PX3 may be arranged to correspond to the third pixel area PA3 of the color control member 100a or 100a'.

At least one insulating layer may be arranged between the first to third pixel circuits 420a, 420b, and 420c, and the display element 430. The display element 430 may include a pixel electrode 431, an intermediate layer 433, and an opposite electrode 435.

The pixel electrode 431 may be connected to a source electrode or a drain electrode of a thin film transistor. A portion of the pixel electrode 431 may be exposed through an opening of a pixel-defining layer 437, and edges of the pixel electrode 431 may be covered by the pixel-defining layer 437. The pixel-defining layer 437 may be arranged to correspond to the light-blocking area BA of the color control member 100a or 100a'. The pixel-defining layer 437 may surround the first to third pixels PX1, PX2, and PX3 and may be located between the display elements 430. That is, regions corresponding to the pixel area PA and the light-blocking area BA of the color control member 100a or 100a' may be respectively the pixel area and the light-blocking area of the substrate 410.

The intermediate layer 433 may be arranged on a portion of the pixel electrode 431 exposed by the pixel-defining layer 437. The intermediate layer 433 may include an organic emission layer, the organic emission layer including a low molecular weight organic material or a polymer organic material. The intermediate layer 433 may selectively further include a functional layer such as a hole transport layer (HTL), a hole injection layer (HIL), an electron transport layer (ETL), and an electron injection layer (EIL).

The opposite electrode 435 may cover the intermediate layer 433 and the pixel-defining layer 437. The opposite electrode 435 may include a transparent or semi-transparent electrode. For example, the opposite electrode 435 may include a metal thin layer having a small work function. The opposite electrode 435 may include a transparent conductive oxide (TCO).

The encapsulation member 300 may be arranged on the display element 430. The encapsulation member 300 may cover the opposite electrode 435 and may be arranged over an entire surface of the substrate 410. The encapsulation member 300 may include a thin-film encapsulation layer. The thin-film encapsulation layer may include at least one inorganic encapsulation layer and at least one organic encapsulation layer. In an embodiment, the thin-film encapsulation layer may have a structure in which a first inorganic encapsulation layer/an organic encapsulation layer/a second inorganic encapsulation layer are stacked.

FIGS. 8A to 8J are schematic cross-sectional views for explaining a process of manufacturing the color control member 100a' according to an embodiment. FIGS. 8A to 8J show cross-sections corresponding to the color control member 100a' shown in FIG. 4.

Figure 8A:
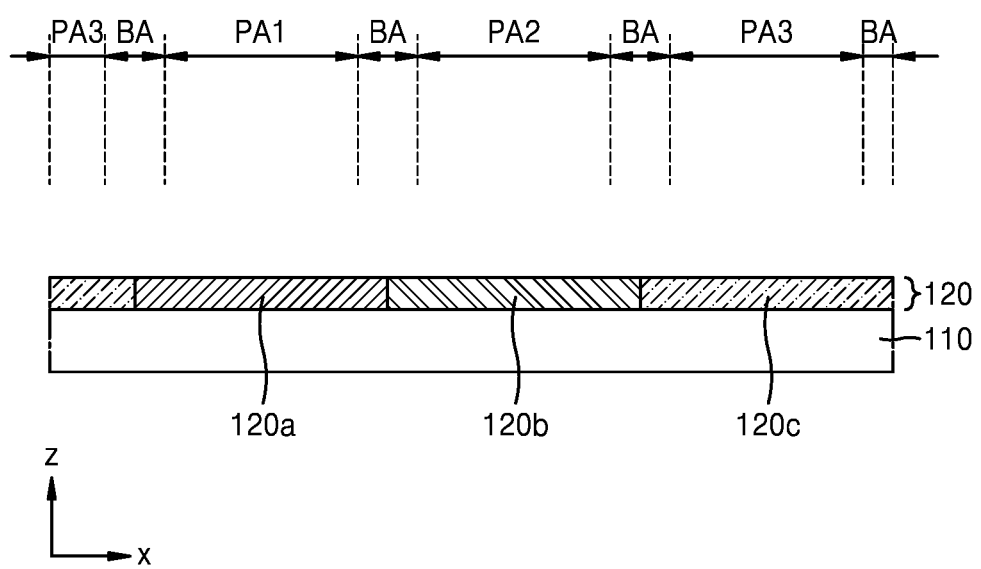
FIGS. 8A to 8J are schematic cross-sectional views for explaining a process of manufacturing a color control member according to an embodiment.

Referring to FIG. 8A, the color filter layer 120 may be arranged on the substrate 110 in which the pixel area PA and the light-blocking area BA are defined. The color filter layer 120 may include the first to third color filter layers 120a, 120b, and 120c each selectively transmitting only light having a predetermined wavelength.

The color filter layer 120 may be formed by repeatedly performing a process of coating a color photoresist on the substrate 110 and then patterning the color photoresist by selectively etching the color photoresist. For example, the first color filter layer 120a may be formed by coating a first color photoresist and then etching the first color photoresist, the second color filter layer 120b may be formed by coating a second color photoresist and then etching the second color photoresist, and the third color filter layer 120c may be formed by coating a third color photoresist and then etching the third color photoresist. The order of forming the first to third color filter layers 120a, 120b, and 120c is not limited.

Figure 8B:
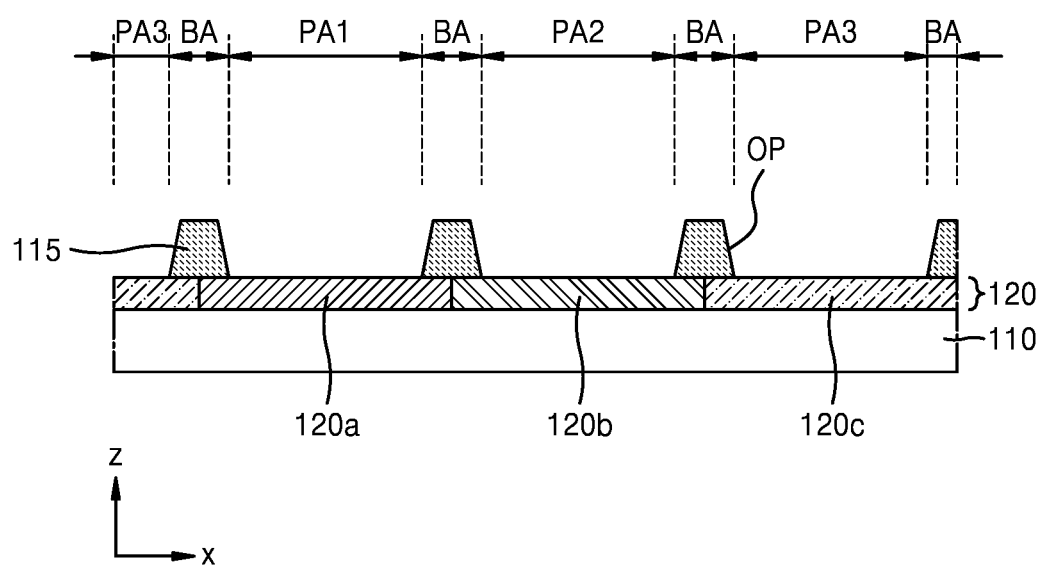

Referring to FIG. 8B, a sacrificial pattern 115 may be formed on the color filter layer 120. The sacrificial pattern 115 may include a photosensitive organic material. For example, the sacrificial pattern 115 may be formed by coating a photosensitive organic material on an entire surface of the substrate 110 using a method such as a slit coating method and a spin coating method, and then forming an opening OP through a photolithography process. The sacrificial pattern 115 may be formed in the light-blocking area BA of the substrate 110, and the color filter layer 120 in the pixel area PA may be exposed through the opening OP.

A lateral wall of the sacrificial pattern 115 may be inclined. A cross-section of the sacrificial pattern 115 may have a tapered shape having a width that is reduced away from the substrate 110. The opening OP may have a width that increases away from the substrate 110.

Figure 8C:
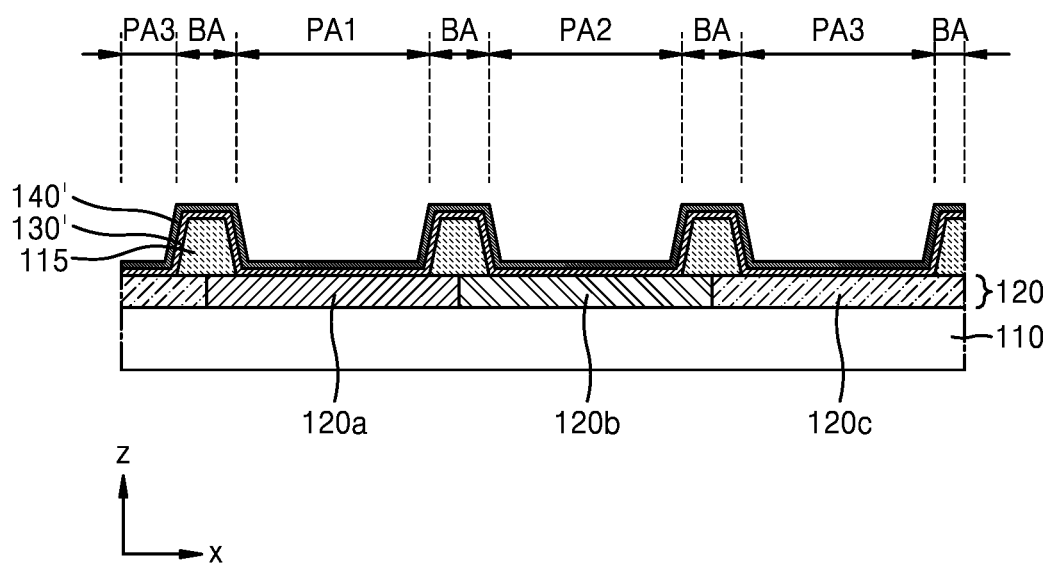

Referring to FIG. 8C, a first material layer 130' and a second material layer 140' may be sequentially formed over the substrate 110, the first material layer 130' and the second material layer 140' covering the sacrificial pattern 115. The first material layer 130' may include silicon nitride ($SiN_x$) and/or silicon oxide ($SiO_x$). The second material layer 140' may include a material having a light reflecting characteristic, for example, a metal.

Figure 8D:
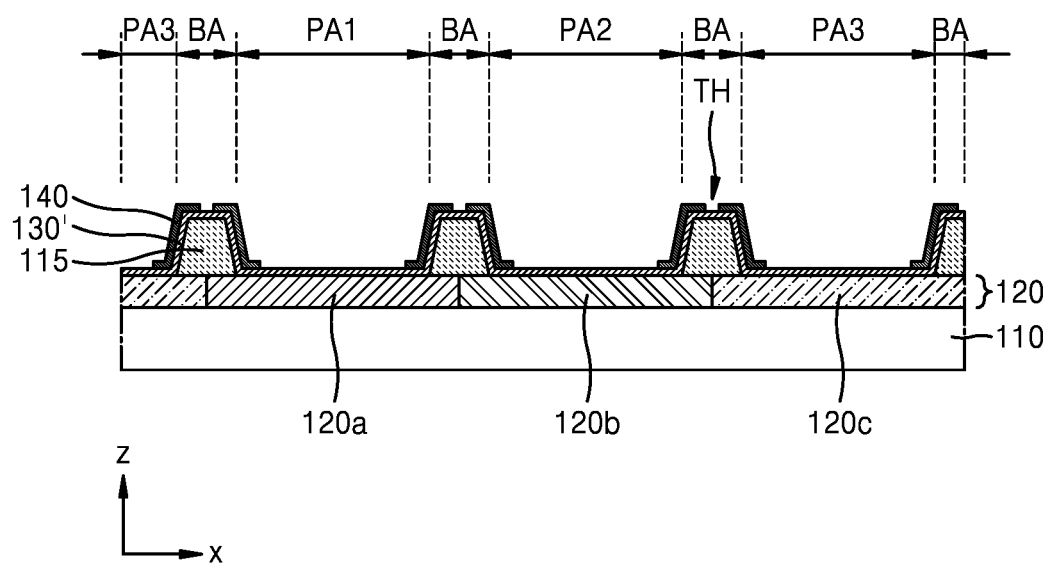

Referring to FIG. 8D, a portion of the second material layer 140' is removed and the reflective layer 140 may be formed. The reflective layer 140 may be formed by coating a photosensitive organic material on the second material layer 140' and then performing a photolithography process. A portion of the first material layer 130' that corresponds to the pixel area PA may be exposed through the reflective layer 140. A through hole TH may be formed in the reflective layer 140, the through hole TH exposing a portion of the first material layer 130' on the sacrificial pattern 115. A portion of the second material layer 140' may be removed by wet etching or a dry etching.

Figure 8E:
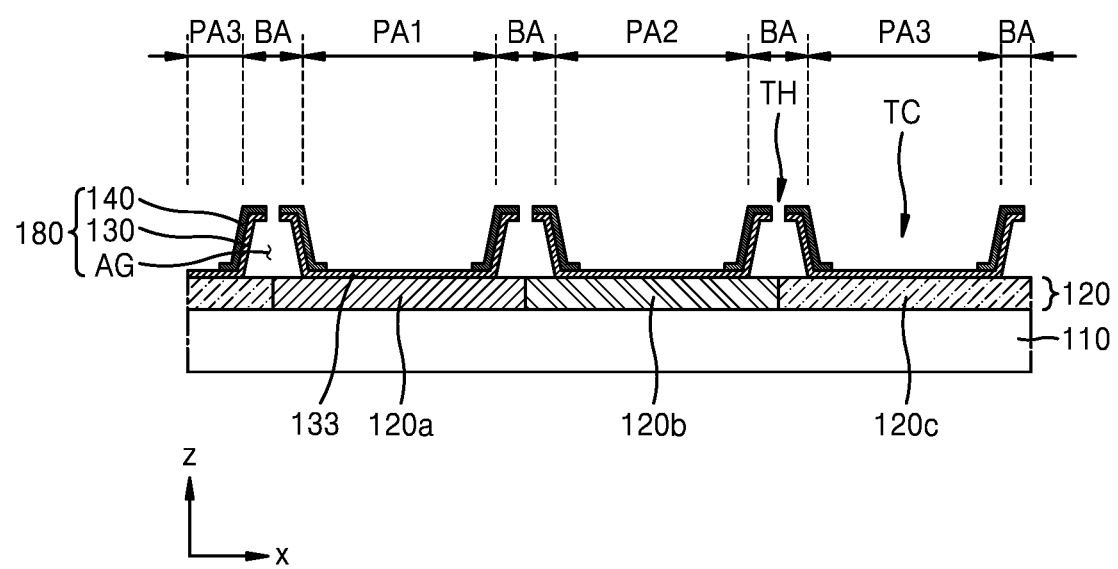

Referring to FIG. 8E, a portion of the first material layer 130' may be removed, and the interface layer 130 including a through hole TH may be formed. A portion of the first material layer 130' that is exposed by the through hole TH of the reflective layer 140 may be removed by using the reflective layer 140 as a mask. The through hole TH of the interface layer 130 may be aligned with by the through hole TH of the reflective layer 140.

The sacrificial pattern 115 may be exposed to the outside by the through holes TH of the interface layer 130 and the reflective layer 140. The sacrificial pattern 115 may be removed through the through holes TH of the interface layer 130 and the reflective layer 140. The interface layer 130 and the color filter layer 120 may form a space defined by surfaces of the interface layer 130 and the color filter layer 120. The space may be the air gap of the partition wall 180.

A photosensitive pattern of the photosensitive organic material on the reflective layer 140, and the sacrificial pattern 115 may be sequentially removed. The photosensitive pattern and the sacrificial pattern 115 may be removed by a strip method.

The interface layer 130 and the reflective layer 140 may be provided inside the opening OP. The interface layer 130 may cover a bottom surface and a lateral surface of the opening OP, and the reflective layer 140 may cover a lateral surface of the opening OP. Therefore, a trench TC corresponding to the pixel area PA may be formed, the trench TC being delimited by the interface layer 130 and the reflective layer 140. As shown in FIG. 8E, the trench TC may have a width that increases away from the substrate 110.

Figure 8F:
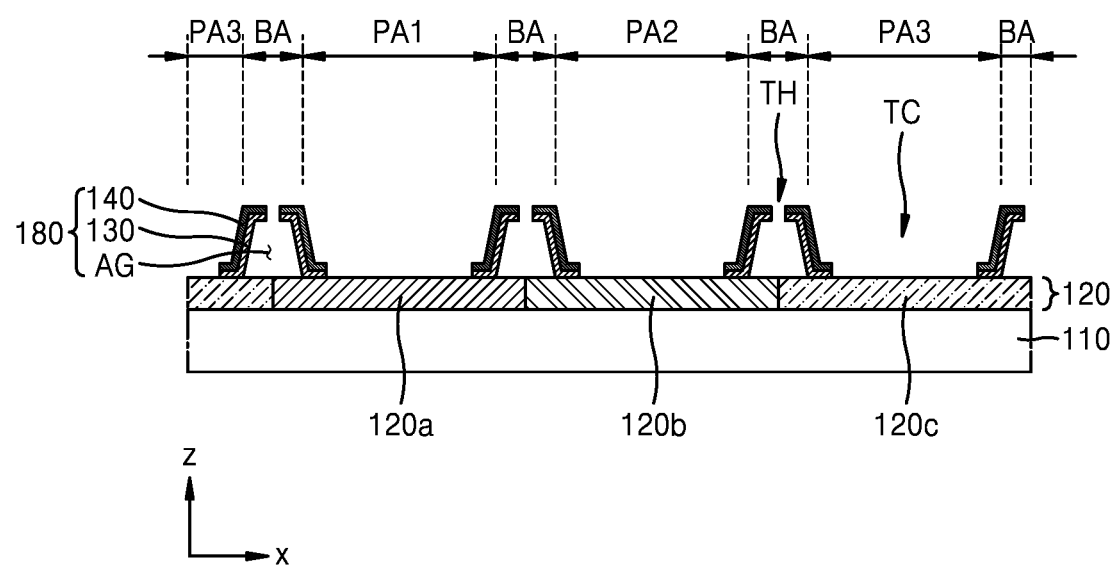

Though it is shown in FIG. 8E that the interface layer 130 includes the third portion 133 corresponding to the pixel area PA, in another embodiment, as shown in FIG. 8F, the third portion 133 of the interface layer 130 that corresponds to the pixel area PA may be removed and thus the interface layer 130 and the reflective layer 140 may have the same pattern. In the structure shown in FIG. 8F, the interface layer 130 that exposes the color filter layer 120 and includes the through hole TH may be formed by removing a portion of the first material layer 130' by using the reflective layer 140 as a mask.

Figure 8G:
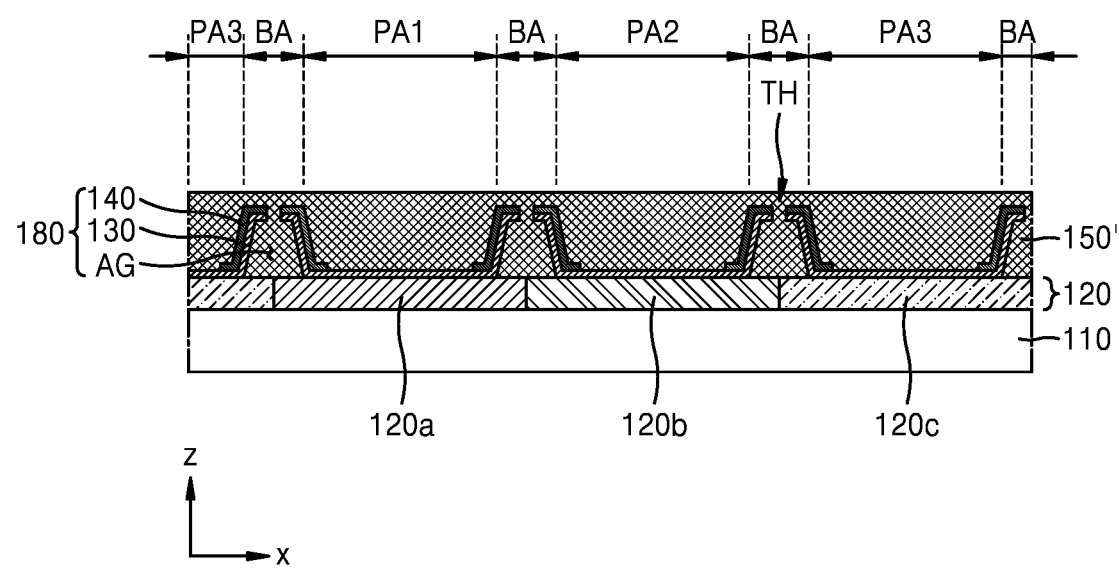

Referring to FIG. 8G, a light-blocking material layer 150' may be formed over the substrate 110. The light-blocking material layer 150' may fill the air gap AG through the through holes TH of the interface layer 130 and the reflective layer 140 and may cover the reflective layer 140 and the trench TC. The light-blocking material layer 150' may include a material that is dissolved in a developing solution used during a development process afterward.

Figure 8H:
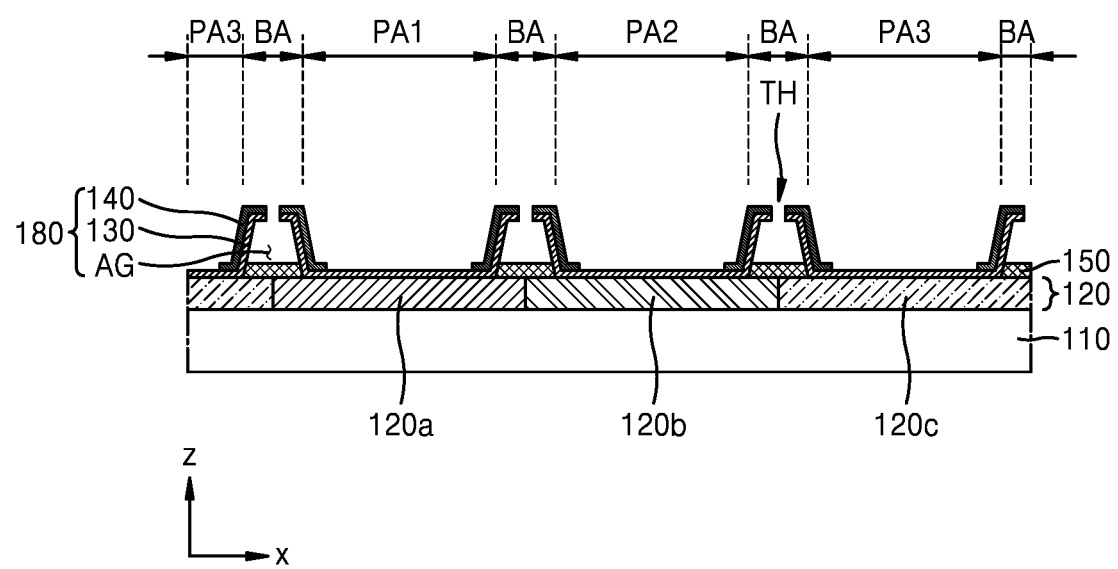

Referring to FIG. 8H, the light-blocking member 150 may be formed in the light-blocking area BA by leaving only a portion of the light-blocking material layer 150' in the inside of the air gap AG and removing the rest of the light-blocking material layer 150'. Since material of the light-blocking material layer 150' is provided via the through holes TH of the interface layer 130 and the reflective layer 140, the light-blocking material layer 150' outside the partition wall 180 may be removed and a portion of the light-blocking material layer 150' inside the air gap AG may remain. An embodiment may selectively remove a portion of the light-blocking material layer 150' by using a developing solution without using a photolithography process that uses a mask. The light-blocking member 150 may have a thickness ranging from about 0.5 μm to about 0.7 μm.

In another embodiment, a photosensitive organic material is coated on the light-blocking material layer 150' and then only the light-blocking material layer 150' outside the partition wall 180 may be removed by performing a photolithography process. Since the light-blocking material layer 150' inside the air gap AG is not removed and may remain, the light-blocking member 150 may fill most of the air gap AG and a predetermined space may be formed to allow liquid drops overflowing into the through hole TH while liquid drops may be coated inside the trench TC so as to form the first color conversion layer 160a, the second color conversion layer 160b, and the transmission layer 170.

The light-blocking member 150 may be disposed between the color filter layer 120 and the partition wall 180. As shown in FIG. 2, when the color control member 100a that does not include the light-blocking member 150 is manufactured, the processes of FIGS. 8G and 8H may be omitted.

Figure 8I:
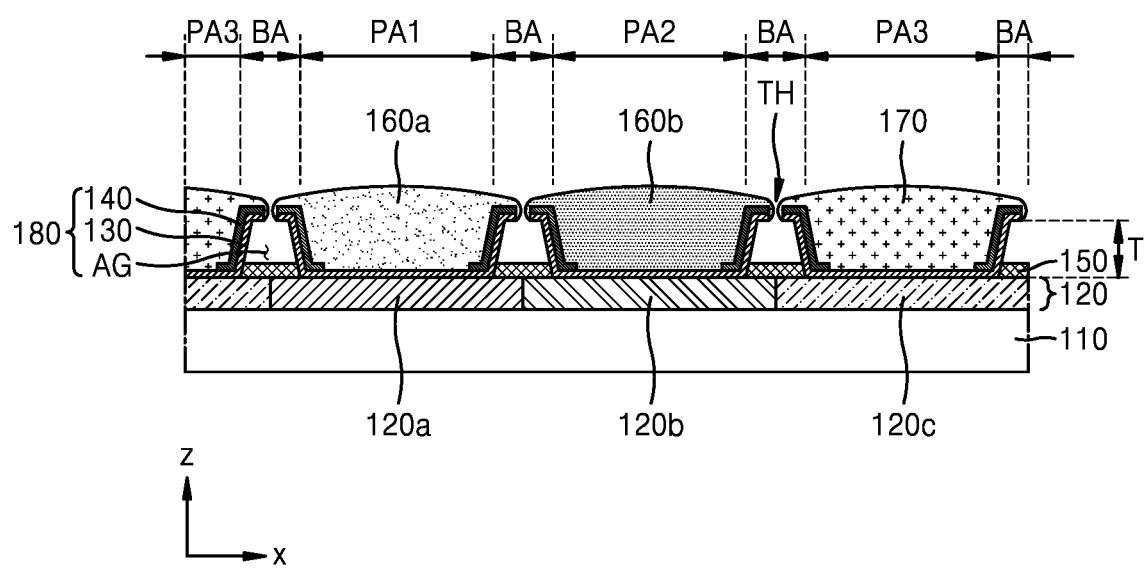
Figure 8J:
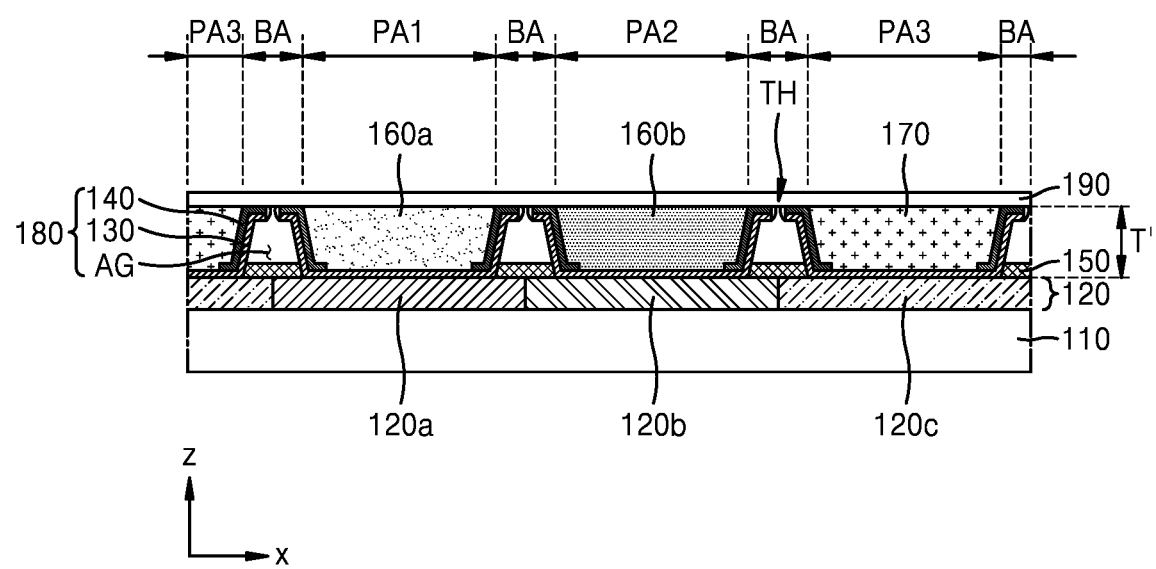

Referring to FIG. 8I and its depiction of conventional inkjet coating process, the first color conversion layer 160a, the second color conversion layer 160b, and the transmission layer 170 may be formed as overlapping the trench TC. The first color conversion layer 160a, the second color conversion layer 160b, and the transmission layer 170 may be formed by an inkjet coating method. Liquid drops coated inside the trench TC by an inkjet coating method may be coated to a height T or more of the partition wall 180. Therefore, in a conventional process, such liquid drops may flow over to a pixel area representing other colors and thus color mixing may occur. In contrast, according to an embodiment, since liquid drops flowing over to an upper portion of the partition wall 180 may flow into the air gap AG through the through holes TH of the interface layer 130 and the reflective layer 140, the liquid drops may not flow to a neighboring trench TC. Therefore, color mixing that occurs when liquid drops flow over to a pixel area representing other colors may be prevented. As shown in FIG. 8J, the liquid drops inside the trench TC may be dried and formed to a height that is substantially the same as a height T' to an upper surface of the reflective layer 140.

The first color conversion layer 160a, the second color conversion layer 160b, and the transmission layer 170 may be formed at locations determined in advance according to a sequence determined in advance. Since the first color conversion layer 160a, the second color conversion layer 160b, and the transmission layer 170 may be formed by an inkjet coating method, a photo process is not necessary. Thus, manufacturing cost may be reduced relative to use of the inkjet coating method.

Referring to FIG. 8J, a planarization layer 190 may be further formed over the substrate 110. The planarization layer 190 may be formed on the first color conversion layer 160a, the second color conversion layer 160b, the transmission layer 170, and the reflective layer 140. The planarization layer 190 may include an organic material having high viscosity such that the planarization layer 190 may not flow into the air gap AG through the through holes TH.

Figure 9:
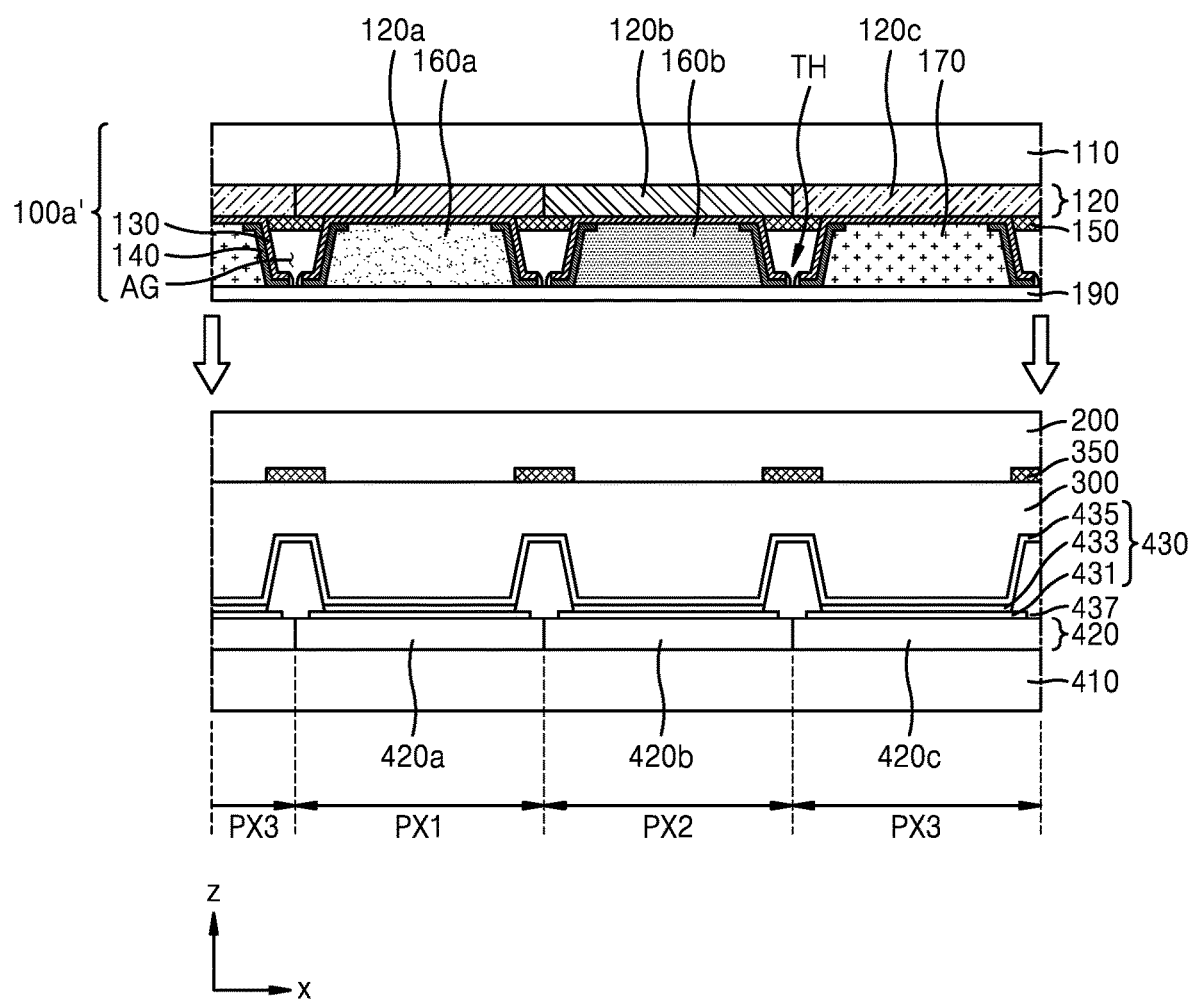
FIG. 9 is a schematic cross-sectional view of coupling between a color control member and a bottom substrate according to an embodiment.

As shown in FIG. 9, the color control member 100a' may be coupled over the encapsulation member 300 on which the light-blocking member 350 is arranged. The filling layer 200 may be formed between the color control member 100a' and the encapsulation member 300. The filling layer 200 may include, for example, at least one of a light-curable epoxy-based material and an acrylate-based material and the embodiment is not limited thereto. FIG. 9 is a schematic cross-sectional view of coupling between a color control member and a bottom substrate according to an embodiment.

Figure 10:
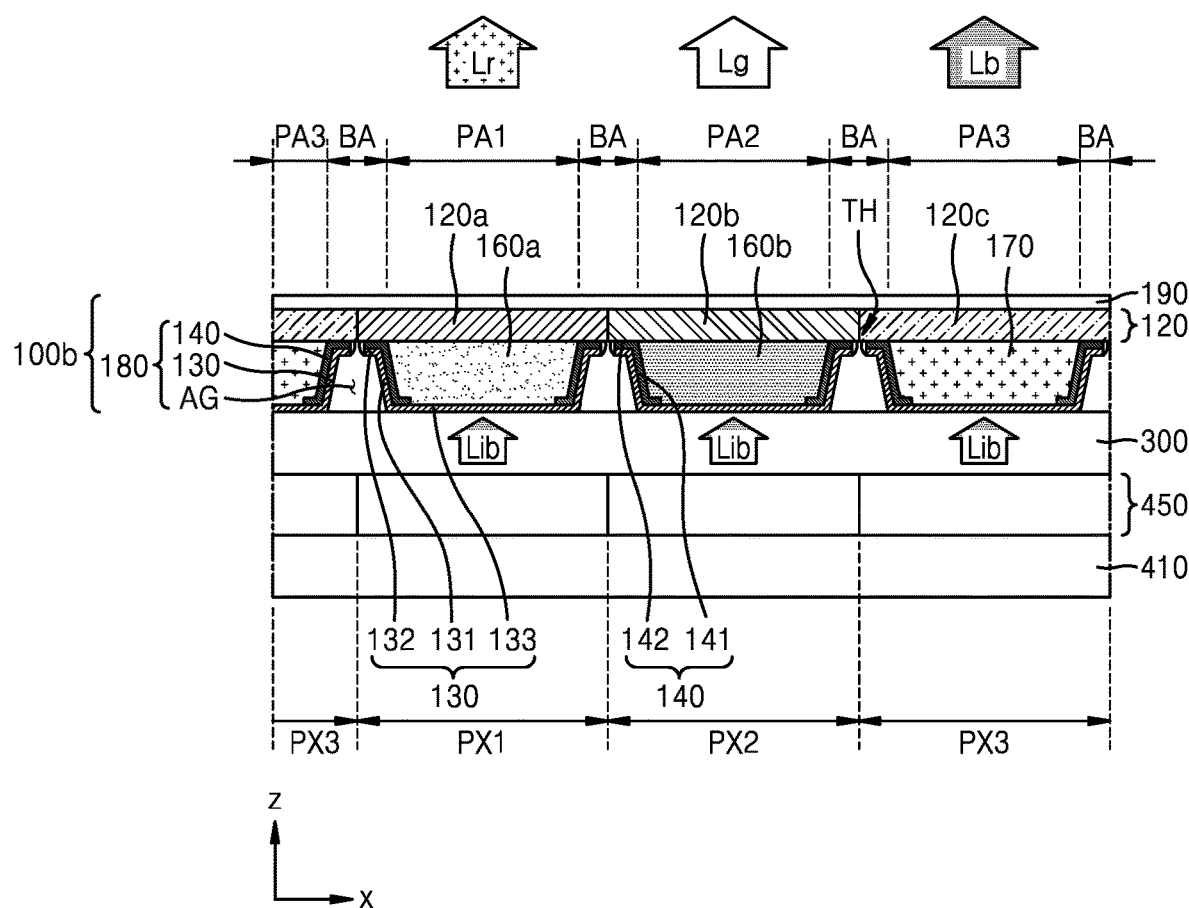
FIGS. 10 and 11 are schematic cross-sectional views of the display device taken along line I-I' of FIG. 1 according to another embodiment.
Figure 11:
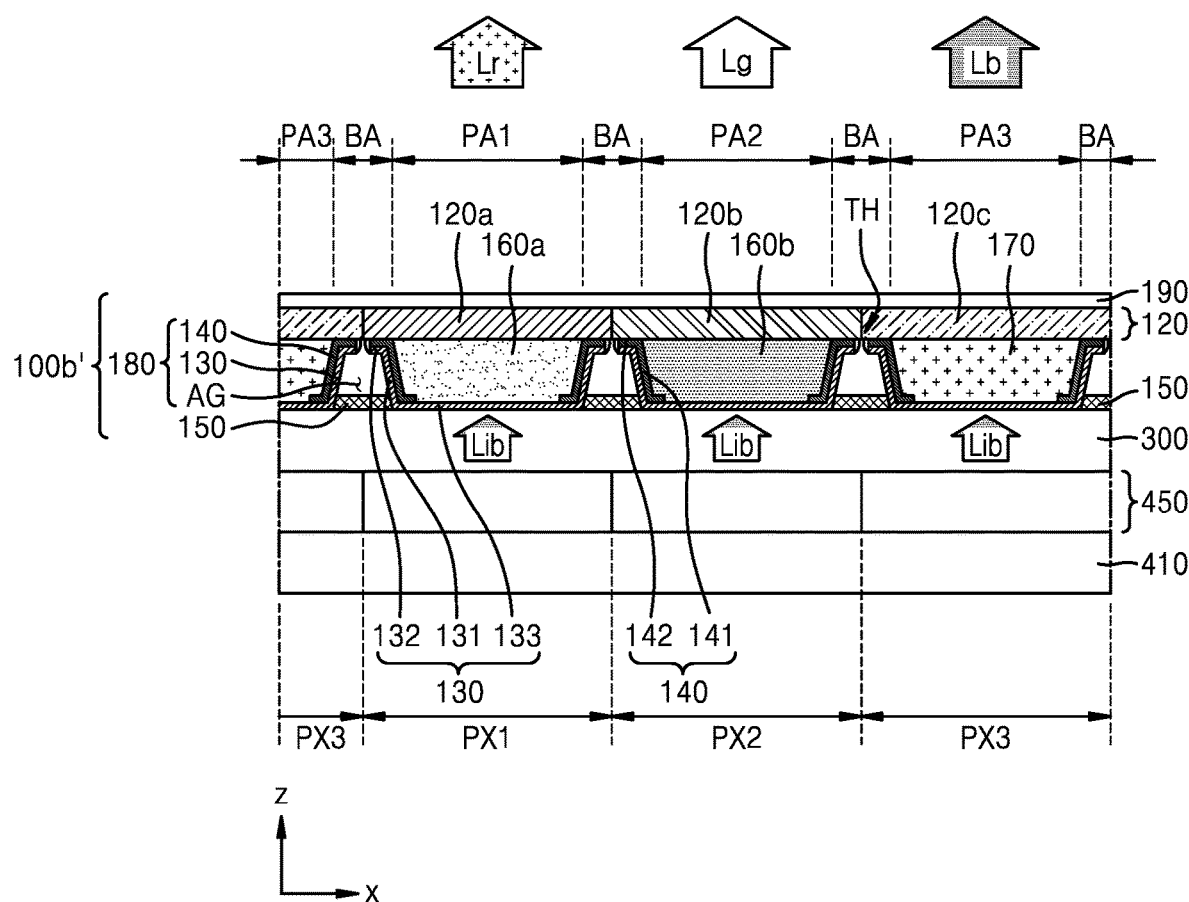

FIGS. 10 and 11 are schematic cross-sectional views of the display device taken along line I-I' of FIG. 1 according to another embodiment. The embodiments of FIGS. 10 and 11 are different from the embodiments of FIGS. 2 and 4 in that the encapsulation member 300 is formed over the substrate 410, and subsequently, a color control member 100b or 100b' is formed on the encapsulation member 300.

Referring to FIG. 10, the display device 1 may include the substrate 410, the encapsulation member 300, and the color control member 100b on the encapsulation member 300 that are sequentially stacked in the third direction (i.e., the z-direction). The encapsulation member 300 may seal a surface of the substrate 410.

The pixel layer 450 may be arranged on the substrate 410. As shown in FIGS. 7A and 7B, pixels may be arranged in a predetermined pattern in the pixel layer 450. The pixels may correspond to the pixel area PA of the color control member 100b. The pixels may include the first pixel PX1, the second pixel PX2, and the third pixel PX3. The encapsulation member 300 may be arranged over the first pixel PX1, the second pixel PX2, and the third pixel PX3. The encapsulation member 300 may cover the first pixel PX1, the second pixel PX2, and the third pixel PX3 and may be arranged over an entire surface of the substrate 410. The encapsulation member 300 may include a thin-film encapsulation layer. The color control member 100b may be arranged on the encapsulation member 300.

The color control member 100b may receive incident lights Lib from the first pixel PX1, the second pixel PX2, and the third pixel PX3 and may emit light Lr of a first color, light Lg of a second color, and light Lb of a third color. The incident light Lib may include light Lb of the third color.

As shown in FIG. 3A, the color control member 100b may be divided into the pixel area PA and the light-blocking area BA. The pixel area PA may be divided into the first pixel area PA1, the second pixel area PA2, and the third pixel area PA3.

The color control member 100b may include the first color conversion layer 160a, the second color conversion layer 160b, and the transmission layer 170. The first color conversion layer 160a may be arranged in the first pixel area PA1, convert incident the light Lib to the light Lr of the first color, and emit the light Lr toward the color filter layer 120. The second color conversion layer 160b may be arranged in the second pixel area PA2, convert incident the light Lib to the light Lg of the second color, and emit the light Lg toward the color filter layer 120. The transmission layer 170 may be arranged in the third pixel area PA3, transmit the light Lb of the third color, and emit the light Lb toward the color filter layer 120.

As shown in FIGS. 3B and 3C, the partition wall 180 may be disposed between the first color conversion layer 160a, the second color conversion layer 160b, and the transmission layer 170. The partition wall 180 may be provided at least in the light-blocking area BA and may include an air gap. The air gap AG may be surrounded by the interface layer 130 and may be an inner cavity of the partition wall 180. The interface layer 130 may provide a support structure for forming the partition wall 180 and may form a lateral surface and a top surface of the partition wall 180 to delimit the partition wall 180. The air gap AG may be an empty space formed by the encapsulation member 300 and the interface layer 130.

The interface layer 130 may include a first portion 131 and a second portion 132, the first portion 131 being the lateral surface of the partition wall 180, and the second portion 132 being the top surface of the partition wall 180. The first portion 131 may be disposed in the light-blocking area BA, and between the first color conversion layer 160a and the second color conversion layer 160b, between the second color conversion layer 160b and the transmission layer 170 and between the transmission layer 170 and the first color conversion layer 160a. The second portion 132 may be disposed in the light-blocking area BA and be spaced apart by a predetermined interval in the third direction (i.e., the z-direction) from the substrate 110. The second portion 132 may extend from a side of the first portion 131 that is away from the substrate 410 and may be connected to the first portion 131. The second portion 132 may include a through hole TH.

The interface layer 130 may further include a third portion 133 arranged in the pixel area PA. The third portion 133 may be disposed between the encapsulation member 300 and the first color conversion layer 160a, between the encapsulation member 300 and the second color conversion layer 160b, and between the encapsulation member 300 and the transmission layer 170. The first portion 131 may connect the second portion 132 to the third portion 133. The first to third portions 131, 132, and 133 may continuously extend to constitute the interface layer 130.

The reflective layer 140 may be further provided on the interface layer 130. The reflective layer 140 may include a first portion 141 and a second portion 142, the first portion 141 being provided on the first portion 131 of the interface layer 130, and the second portion 142 being provided on the second portion 132 of the interface layer 130. The second portion 142 may extend from a side of the first portion 141 that is away from the substrate 110 and may be connected to the first portion 141. The second portion 142 may include a through hole TH. The through hole TH of the reflective layer 140 may overlap the through hole TH of the interface layer 130. The through hole TH of the interface layer 130 and the through hole TH of the reflective layer 140 may be provided as holes having a predetermined interval with respect to each other. A portion of the first portion 141 of the reflective layer 140 may extend on the third portion 133 of the interface layer 130. In another embodiment, the first portion 141 of the reflective layer 140 may not extend on the third portion 133 of the interface layer 130.

The color control member 100b may further include the first color filter layer 120a on the first color conversion layer 160a, the second color filter layer 120b on the second color conversion layer 160b, and the third color filter layer 120c on the transmission layer 170. The color control member 100b may further include the planarization layer 190 arranged on the color filter layer 120.

In another embodiment, as shown in FIG. 11, the color control member 100b' may further include the light-blocking member 150 inside the air gap AG. The light-blocking member 150 may be disposed in the light-blocking area BA and located between the partition wall 180 and the encapsulation member 300. The light-blocking member 150 may directly contact the encapsulation member 300.

FIGS. 12A to 12J are schematic cross-sectional views for explaining a process of manufacturing a color control member according to an embodiment. FIGS. 12A to 12J are schematic cross-sectional views for explaining a process of manufacturing the color control member shown in FIG. 11.

Figure 12A:
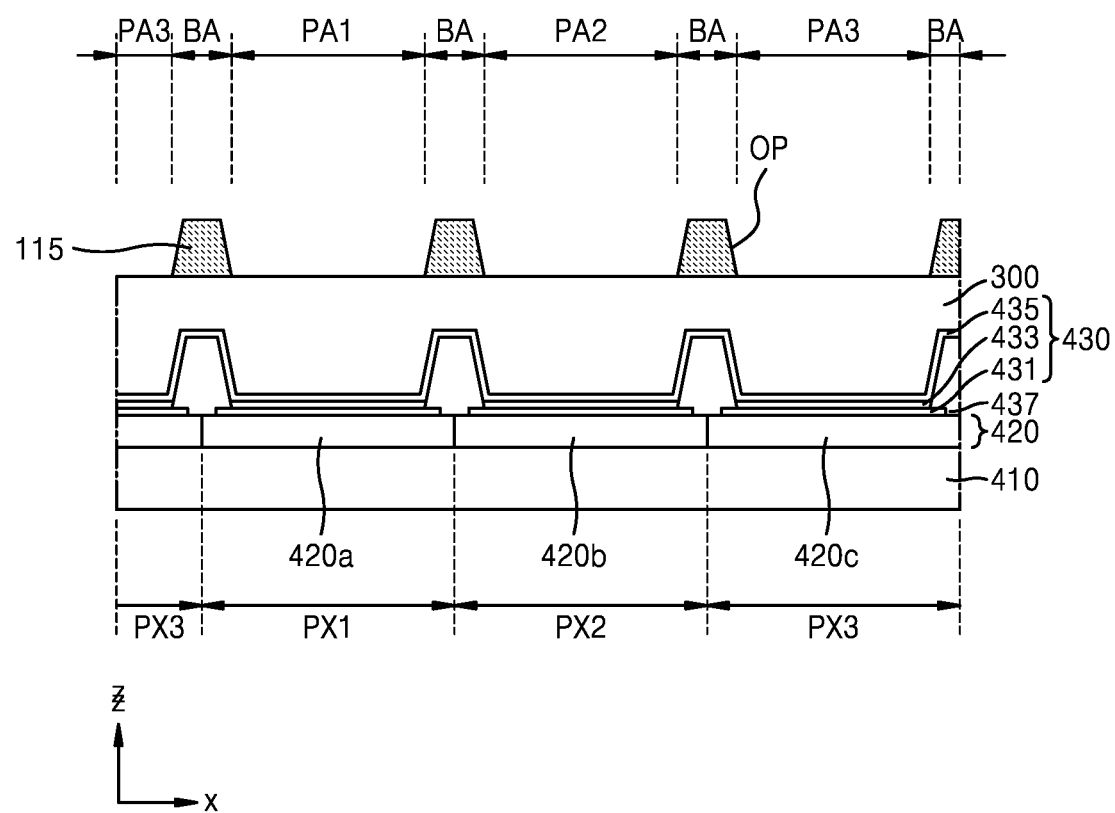
FIGS. 12A to 12J are schematic cross-sectional views for explaining a process of manufacturing a color control member according to an embodiment.

Referring to FIG. 12A, the sacrificial pattern 115 may be formed on the encapsulation member 300. The sacrificial pattern 115 may include a photosensitive organic material. For example, the sacrificial pattern 115 may be formed by coating a photosensitive organic material on an entire surface of the encapsulation member 300 using a method such as a slit coating method and a spin coating method, and then forming an opening OP through a photolithography process. The sacrificial pattern 115 may be formed in the light-blocking area BA, and the encapsulation member 300 in the pixel area PA may be exposed through the opening OP.

A lateral wall of the sacrificial pattern 115 may be inclined. A shape of the sacrificial pattern 115 when viewed in cross-section may have a taper having a width reducing away from the encapsulation member 300. A width of the opening OP may increase away from the encapsulation member 300.

The pixel layer 450 may be arranged between the substrate 410 and the encapsulation member 300. The first pixel PX1, the second pixel PX2, and the third pixel PX3 may be arranged in the pixel layer 450. The first to third pixel circuits 420a, 420b, and 420c respectively of the first pixel PX1, the second pixel PX2, and the third pixel PX3 may be arranged in the pixel circuit layer 420. The display element 430 may be provided on the pixel circuit layer 420. The display element 430 may include an organic light-emitting diode OLED. The display element 430 may emit light of the third color, for example, blue light Lb, the light having an amount of light controlled by the first to third pixel circuits 420a, 420b, and 420c. The first to third pixel circuits 420a, 420b, and 420c each may or may not partially overlap the display element 430.

The display element 430 may be arranged to correspond to the pixel area PA of the color control member 100b'. The display element 430 may include the pixel electrode 431, the intermediate layer 433, and the opposite electrode 435. A portion of the pixel electrode 431 may be exposed through the opening of the pixel-defining layer 437, and edges of the pixel electrode 431 may be covered by the pixel-defining layer 437. The pixel-defining layer 437 may be arranged to correspond to the light-blocking area BA of the color control member 100. The encapsulation member 300 may be arranged on the display element 430. The encapsulation member 300 may include a thin-film encapsulation layer.

Figure 12B:
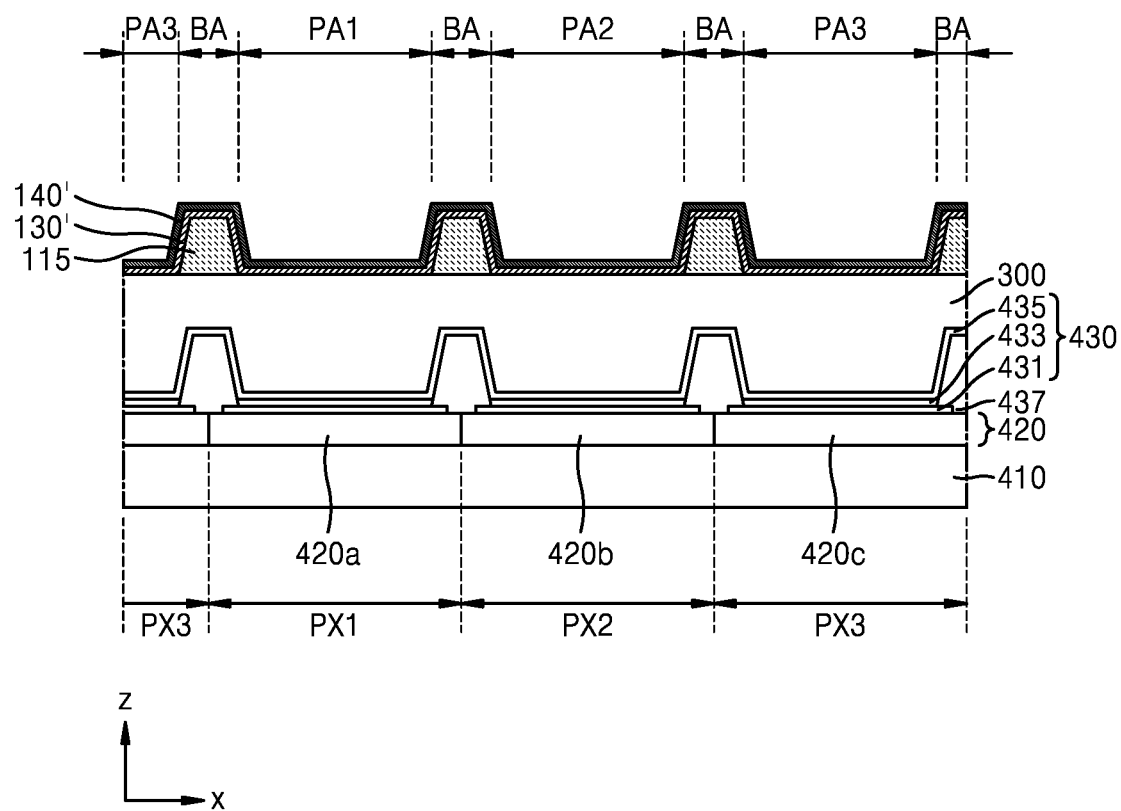

Referring to FIG. 12B, the first material layer 130' and the second material layer 140' may be sequentially formed on the encapsulation member 300. The first material layer 130' and the second material layer 140' may cover the sacrificial pattern 115.

Figure 12C:
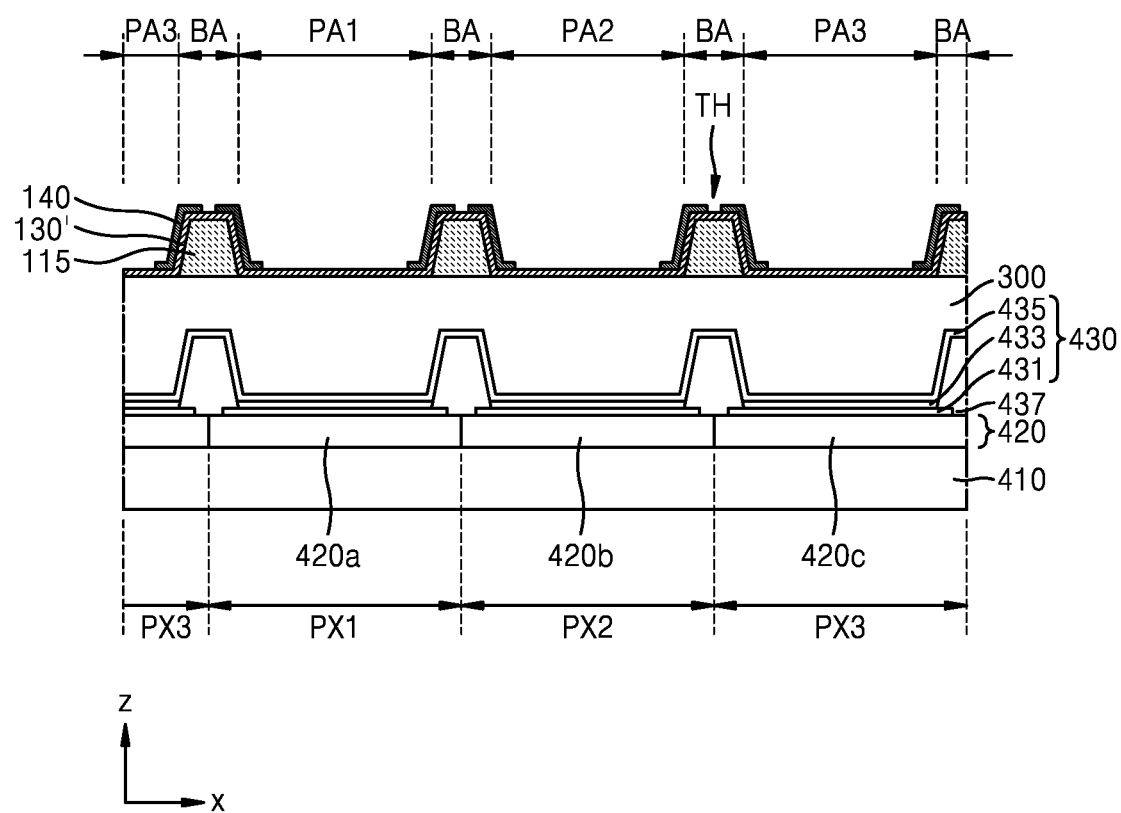

Referring to FIG. 12C, a portion of the second material layer 140' may be removed, and the reflective layer 140 may be formed. The reflective layer 140 may expose the first material layer 130' in the pixel area PA. A through hole TH may be formed in the reflective layer 140. The through hole TH may expose a portion of the first material layer 130' on the sacrificial pattern 115.

Figure 12D:
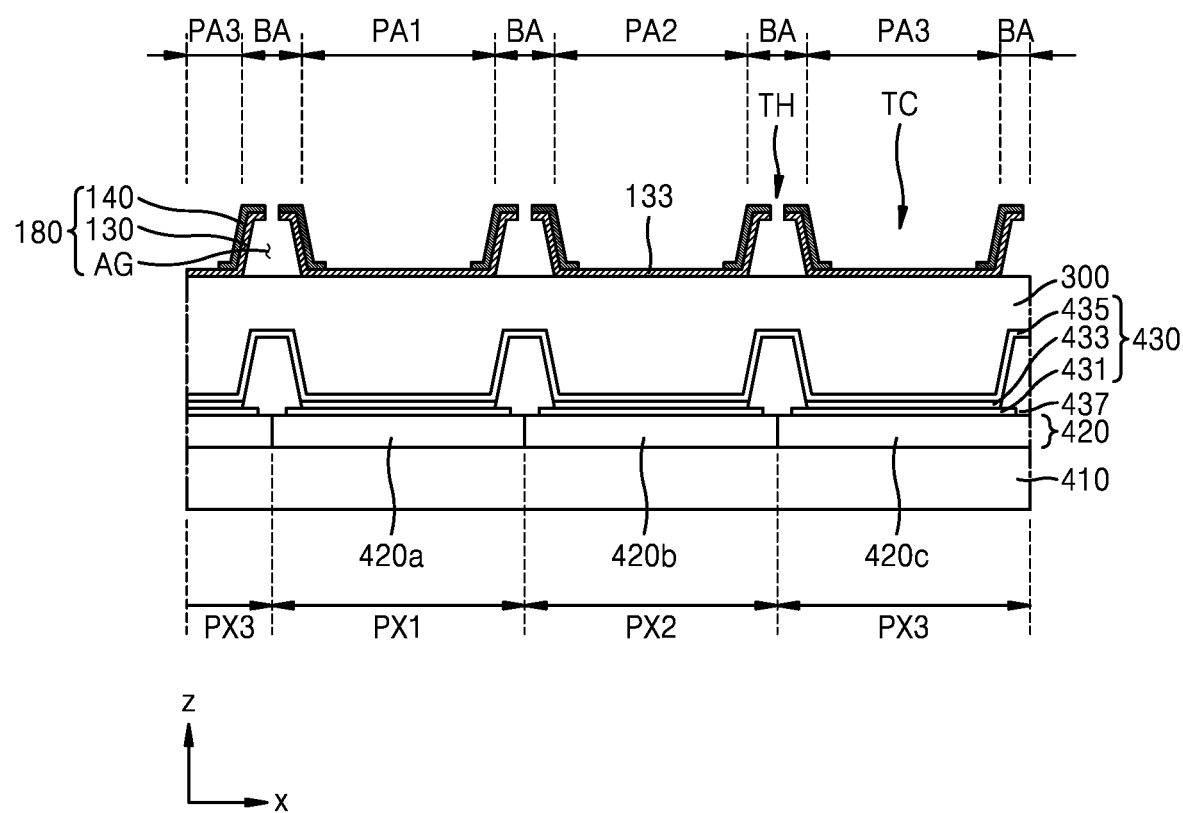

Referring to FIG. 12D, a portion of the first material layer 130' may be removed, and the interface layer 130 including a through hole TH may be formed. A portion of the first material layer 130' that is exposed by the through hole TH of the reflective layer 140 may be removed by using the reflective layer 140 as a mask. The through hole TH of the interface layer 130 may be aligned with the through hole TH of the reflective layer 140.

The sacrificial pattern 115 may be exposed to the outside by the through holes TH of the interface layer 130 and the reflective layer 140. The sacrificial pattern 115 may be removed through the through holes TH of the interface layer 130 and the reflective layer 140. The interface layer 130 and the encapsulation member 300 may form a space defined by surfaces of the interface layer 130 and the encapsulation member 300. The space may be the air gap of the partition wall 180.

A photosensitive pattern of the photosensitive organic material on the reflective layer 140, and the sacrificial pattern 115 may be sequentially removed. The photosensitive pattern and the sacrificial pattern 115 may be removed by a strip method.

The interface layer 130 and the reflective layer 140 may be provided inside the opening OP, the interface layer 130 covering a bottom surface and a lateral surface of the opening OP, and the reflective layer 140 covering a lateral surface of the opening OP. Therefore, a trench TC corresponding to the pixel area PA may be formed, the trench TC being delimited by the interface layer 130 and the reflective layer 140. As shown in FIG. 12D, the trench TC may have a width that increases away from the substrate 410.

Figure 12E:
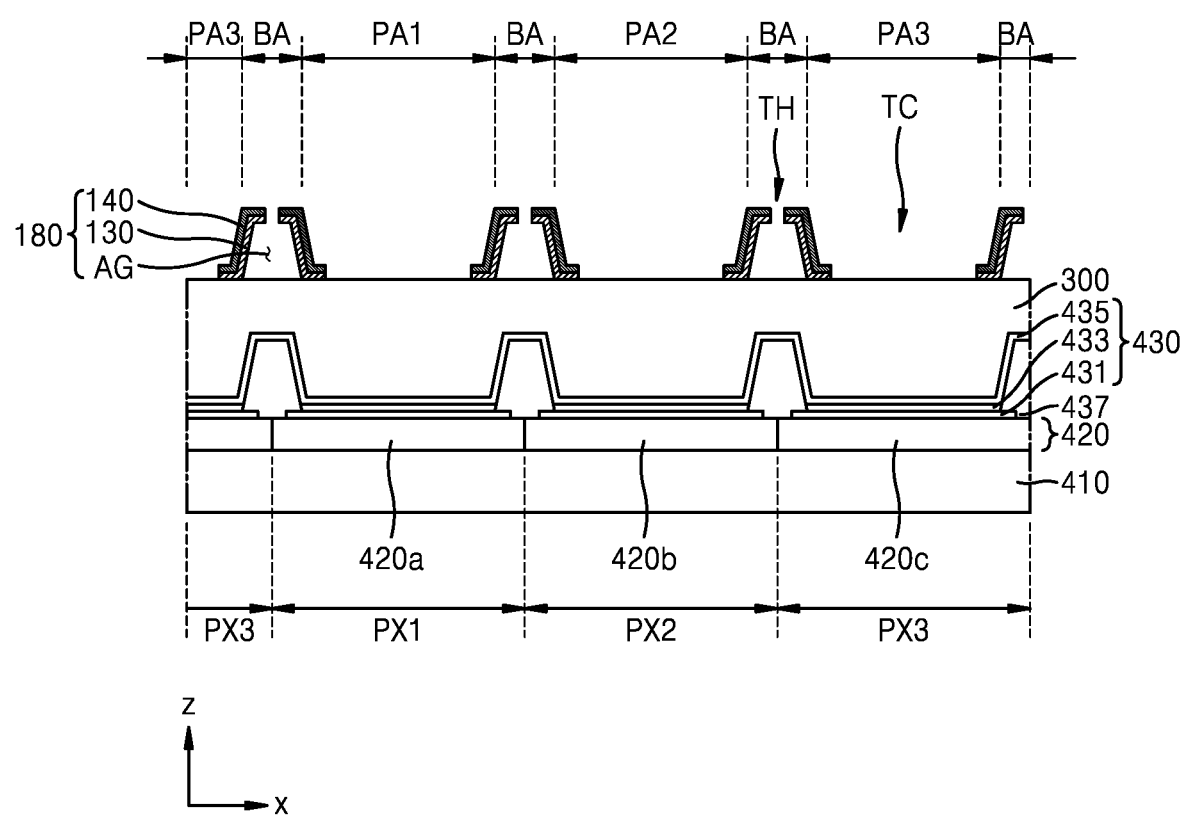

In another embodiment, as shown in FIG. 12E, the third portion 133 of the interface layer 130 that corresponds to the pixel area PA may be removed and thus the interface layer 130 and the reflective layer 140 may have the same pattern. In the structure shown in FIG. 12C, the interface layer 130 may expose the encapsulation member 300 via the through hole TH and may be formed by removing a portion of the first material layer 130' by using the reflective layer 140 as a mask.

Figure 12F:
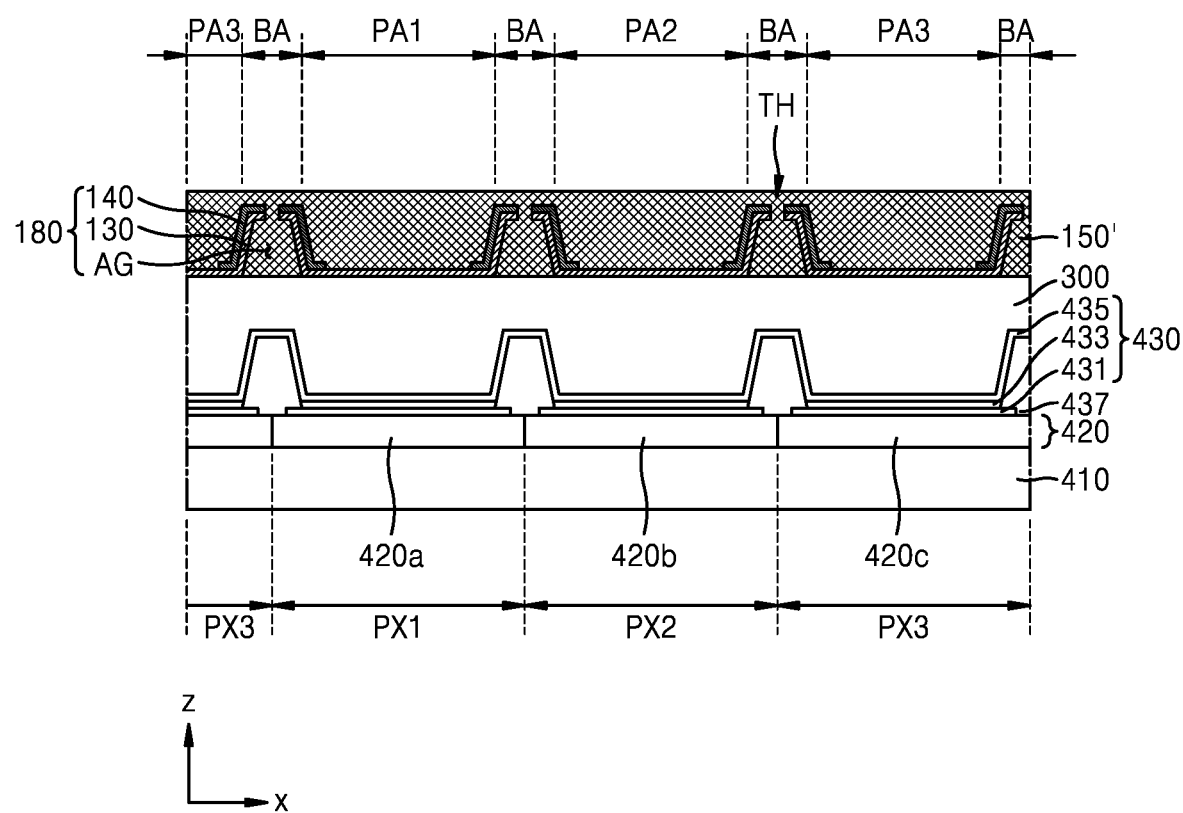

Referring to FIG. 12F, the light-blocking material layer 150' may be formed over the substrate 410. The light-blocking material layer 150' may fill the air gap AG through the through holes TH of the interface layer 130 and the reflective layer 140 and may cover the reflective layer 140 and the trench TC.

Figure 12G:
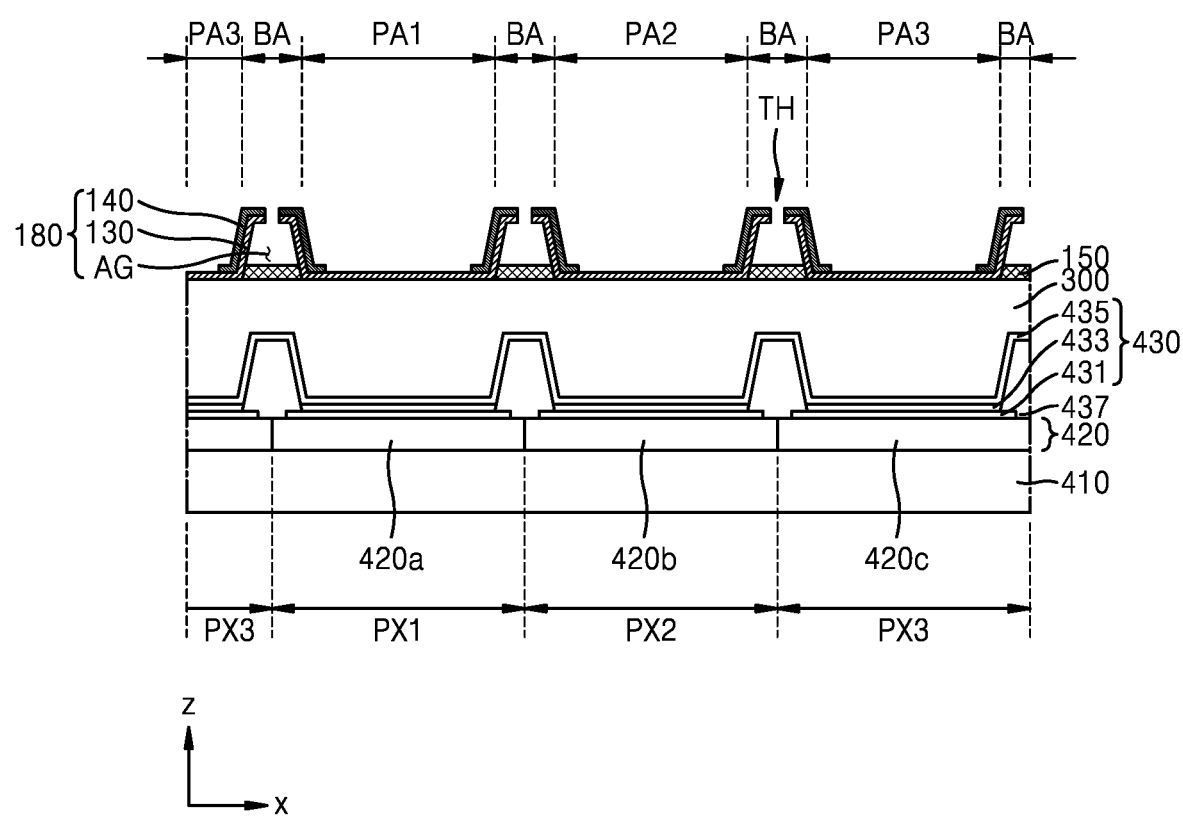

Referring to FIG. 12G, the light-blocking member 150 may be formed in the light-blocking area BA by leaving only a portion of the light-blocking material layer 150' in the air gap AG and removing the rest of the light-blocking material layer 150'. Since material of the light-blocking material layer 150' may be provided via the through holes TH of the interface layer 130 and the reflective layer 140, the light-blocking material layer 150' outside the partition wall 180 may be removed and a portion of the light-blocking material layer 150' inside the air gap AG may remain.

The light-blocking member 150 may be disposed between the encapsulation member 300 and the partition wall 180. As shown in FIG. 10, when the color control member 100b that does not include the light-blocking member 150 is manufactured, the processes of FIGS. 12F and 12G may be omitted.

Figure 12H:
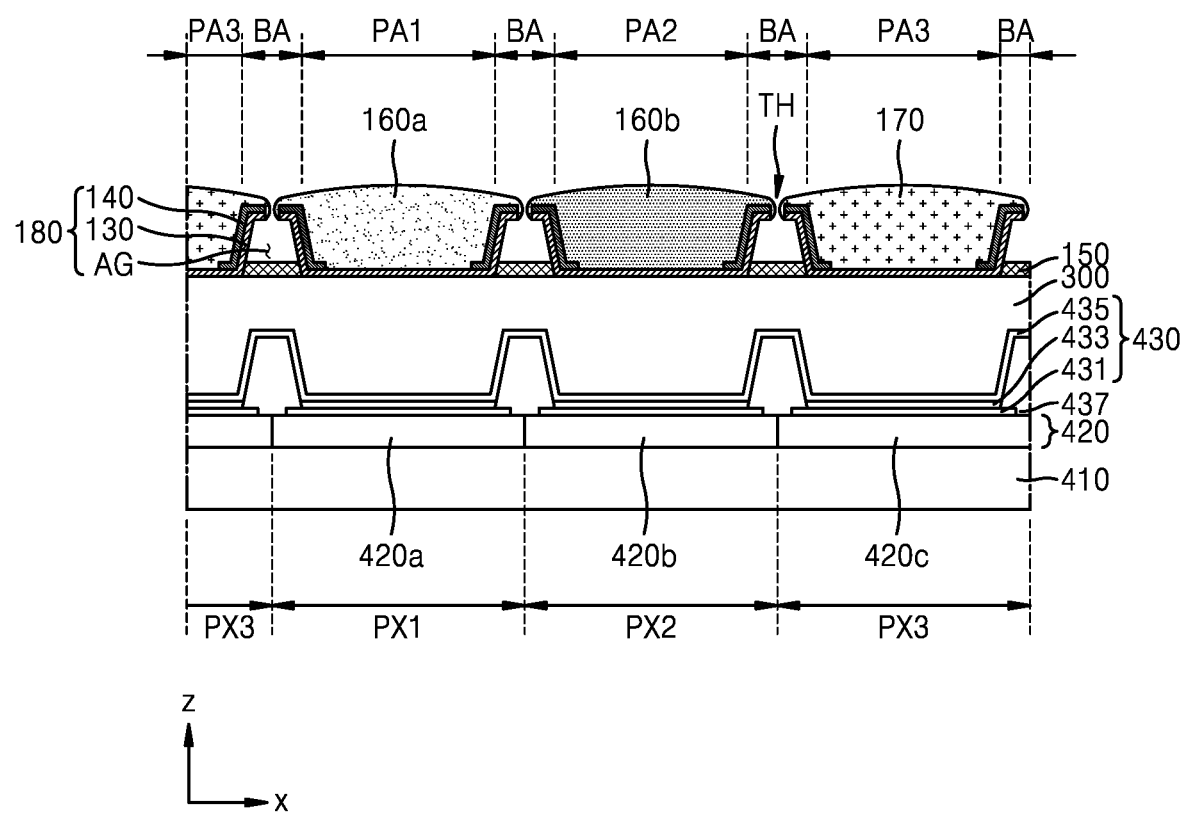
Figure 12I:
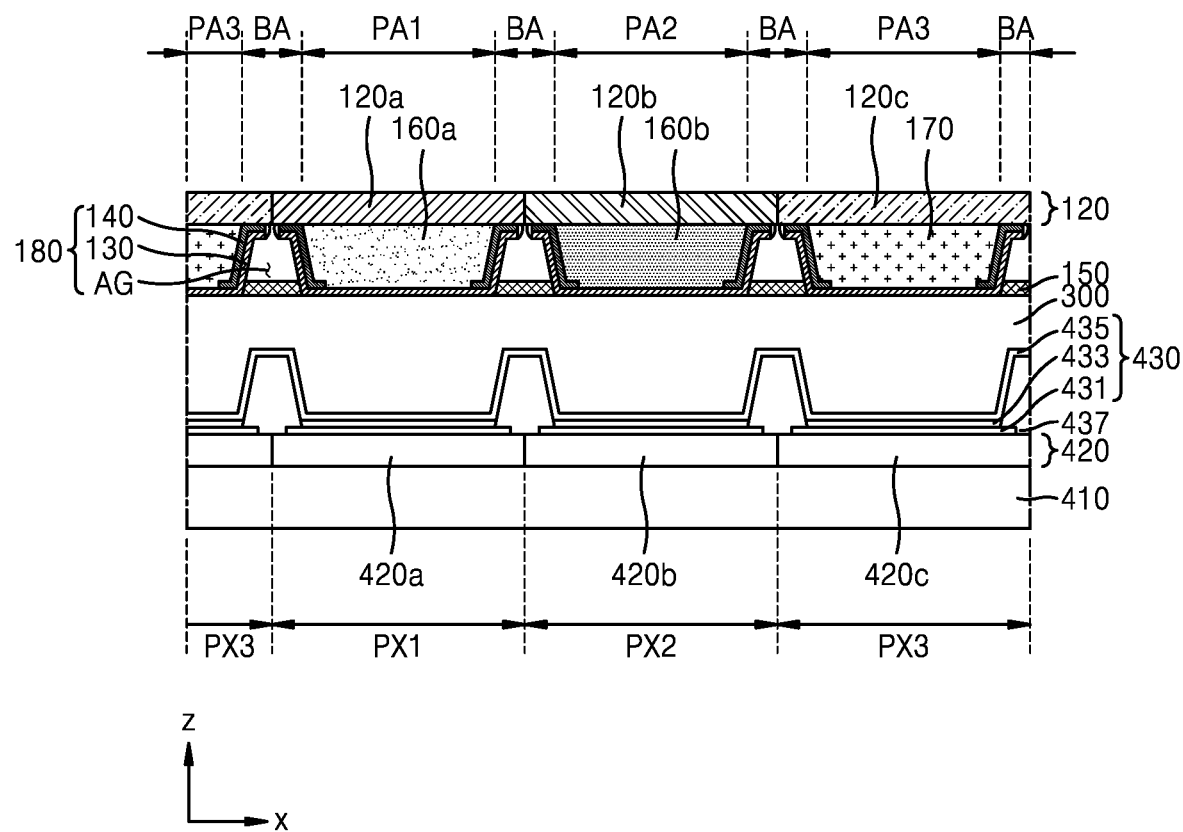

Referring to FIG. 12H, the first color conversion layer 160a, the second color conversion layer 160b, and the transmission layer 170 each burying the trench TC may be formed. The first color conversion layer 160a, the second color conversion layer 160b, and the transmission layer 170 may be formed by an inkjet coating method. Since liquid drops may flow over to an upper portion of the partition wall 180 due to the inkjet coating method and may flow into the air gap AG through the through holes TH, the liquid drops may not flow to a neighboring trench TC. As shown in FIG. 12I, the liquid drops inside the trench TC may be dried and formed at substantially the same level as a top surface of the reflective layer 140.

Referring to FIG. 12I, the first color filter layer 120a on the first color conversion layer 160a, the second color filter layer 120b on the second color conversion layer 160b, and the third color filter layer 120c on the transmission layer 170 may be further formed. The color filter layer 120 may be formed by repeatedly performing a process of coating a color photoresist on the substrate 110 and then patterning the color photoresist by selectively etching the color photoresist.

Figure 12J:
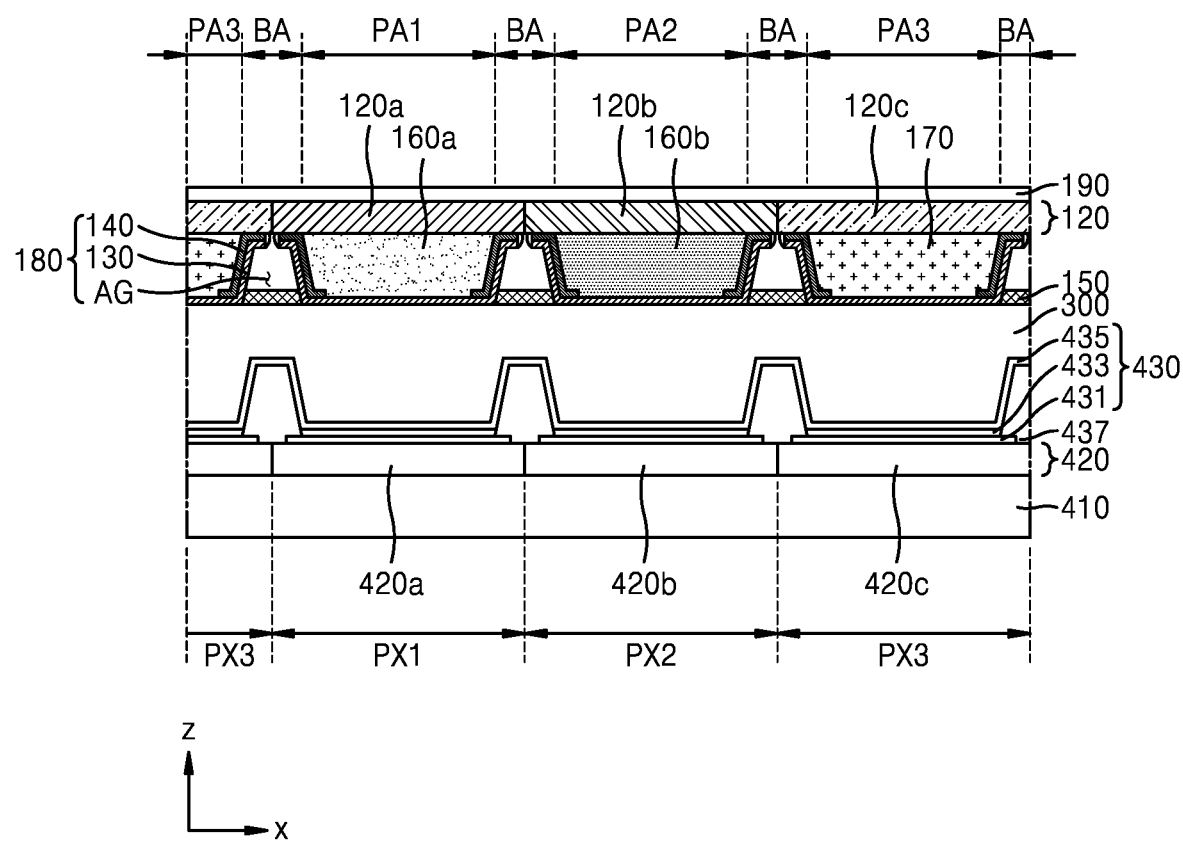

Referring to FIG. 12J, the planarization layer 190 may be further formed on the color filter layer 120.

Figure 13:
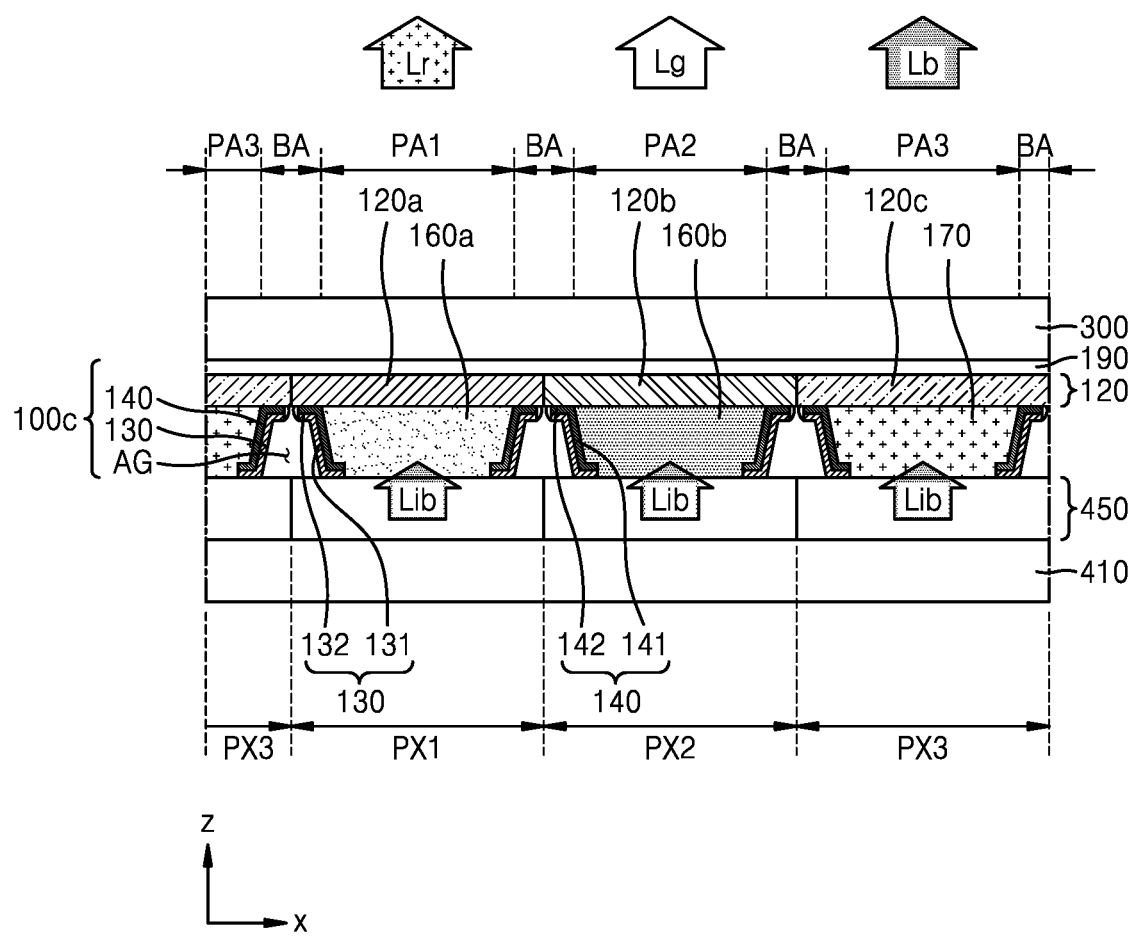
FIGS. 13 and 14 are schematic cross-sectional views of the display device taken along line I-I' of FIG. 1 according to another embodiment.
Figure 14:
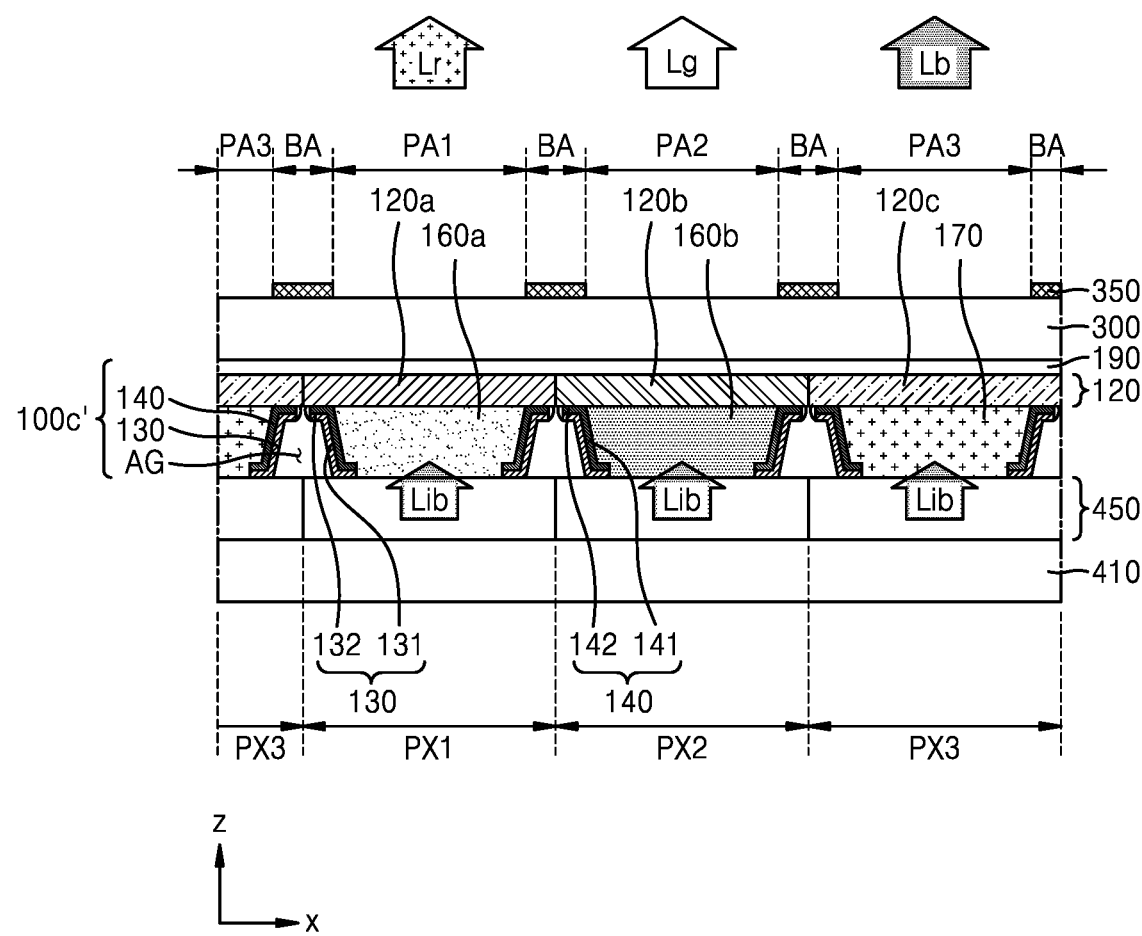

FIGS. 13 and 14 are schematic cross-sectional views of the display device taken along line I-I' of FIG. 1 according to another embodiment. The embodiments of FIGS. 13 and 14 are different from the embodiments of FIGS. 2 and 4 in that a color control member 100c or 100c' is formed on the pixel layer 450 on the substrate 410 and then the encapsulation member 300 is formed.

Referring to FIG. 13, the display device 1 may include the substrate 410, the color control member 100c, and the encapsulation member 300 on the color control member 100c that are sequentially stacked in the third direction (i.e., the z-direction).

The pixel layer 450 may be arranged on the substrate 410. As shown in FIGS. 7A and 7B, pixels may be arranged in a predetermined pattern in the pixel layer 450, and may correspond to the pixel area PA of the color control member 100b. The pixels may include the first pixel PX1, the second pixel PX2, and the third pixel PX3. The color control member 100c may be arranged on the pixel layer 450.

The color control member 100c may receive incident lights Lib from the first pixel PX1, the second pixel PX2, and the third pixel PX3 and may emit light Lr of a first color, light Lg of a second color, and light Lb of a third color. The incident light Lib may include light Lb of the third color.

As shown in FIG. 3A, the color control member 100c may be divided into the pixel area PA and the light-blocking area BA. The pixel area PA may be divided into the first pixel area PA1, the second pixel area PA2, and the third pixel area PA3.

The color control member 100c may include the first color conversion layer 160a, the second color conversion layer 160b, and the transmission layer 170. The first color conversion layer 160a may be arranged in the first pixel area PA1, convert incident light Lib to the light Lr of the first color, and emit the light Lr toward the color filter layer 120. The second color conversion layer 160b may be arranged in the second pixel area PA2, convert incident light Lib to the light Lg of the second color, and emit the light Lg toward the color filter layer 120. The transmission layer 170 may be arranged in the third pixel area PA3, transmit the light Lb of the third color, and emit the light Lb toward the color filter layer 120.

As shown in FIGS. 3B and 3C, the partition wall 180 may be disposed between the first color conversion layer 160a, the second color conversion layer 160b, and the transmission layer 170. The partition wall 180 may be provided at least in the light-blocking area BA and may include an air gap. The air gap AG may be surrounded by the interface layer 130 and may be an inner cavity of the partition wall 180. The interface layer 130 may provide a support structure for forming the partition wall 180 and may form a lateral surface and a top surface of the partition wall 180 to delimit the partition wall 180. The air gap AG may be an empty space formed by the opposite electrode 435 (see FIG. 15D) and the interface layer 130.

The interface layer 130 may include a first portion 131 and a second portion 132, the first portion 131 being the lateral surface of the partition wall 180, and the second portion 132 being the top surface of the partition wall 180. The first portion 131 may be disposed in the light-blocking area BA, and between the first color conversion layer 160a and the second color conversion layer 160b, between the second color conversion layer 160b and the transmission layer 170 and between the transmission layer 170 and the first color conversion layer 160a. The second portion 132 may be located in the light-blocking area BA and be apart by a predetermined interval in the third direction (the z-direction) from the pixel layer 450. The second portion 132 may extend from a side of the first portion 131 that is away from the substrate 410 and may be connected to the first portion 131. The second portion 132 may include a through hole TH.

The reflective layer 140 may be further disposed on the interface layer 130. The interface layer 130 may have the same pattern as that of the reflective layer 140. The reflective layer 140 may include a first portion 141 and a second portion 142, the first portion 141 being provided on the first portion 131 of the interface layer 130, and the second portion 142 being provided on the second portion 132 of the interface layer 130. The second portion 142 may include a through hole TH. The through hole TH of the reflective layer 140 may overlap the through hole TH of the interface layer 130. The through hole TH of the interface layer 130 and the through hole TH of the reflective layer 140 may be provided as holes with a predetermined interval therebetween.

A portion of the first portion 131 of the interface layer 130 and a portion of the first portion 141 of the reflective layer 140 may extend on the opposite electrode 435 and thus the extended portion of the interface layer 130 may directly contact the opposite electrode 435. In another embodiment, the first portion 131 of the interface layer 130 and the first portion 141 of the reflective layer 140 may not extend on the opposite electrode 435.

The color control member 100c may further include the first color filter layer 120a on the first color conversion layer 160a, the second color filter layer 120b on the second color conversion layer 160b, and the third color filter layer 120c on the transmission layer 170.

The color control member 100c may further include the planarization layer 190 arranged on the color filter layer 120. The encapsulation member 300 may be arranged on the planarization layer 190. The encapsulation member 300 may cover the color control member 100c and may be arranged on an entire surface of the substrate 410. The encapsulation member 300 may include a thin-film encapsulation layer. In another embodiment, the planarization layer 190 may be omitted and the encapsulation member 300 may be directly arranged on the color filter layer 120.

In another embodiment, as shown in FIG. 14, the color control member 100c' may further include the light-blocking member 350 on the encapsulation member 300. The light-blocking member 350 may be located in the light-blocking area BA. The light-blocking member 350 may directly contact the encapsulation member 300.

FIGS. 15A to 15H are cross-sectional views for explaining a process of manufacturing a color control member according to an embodiment. [BB1]

Figure 15A:
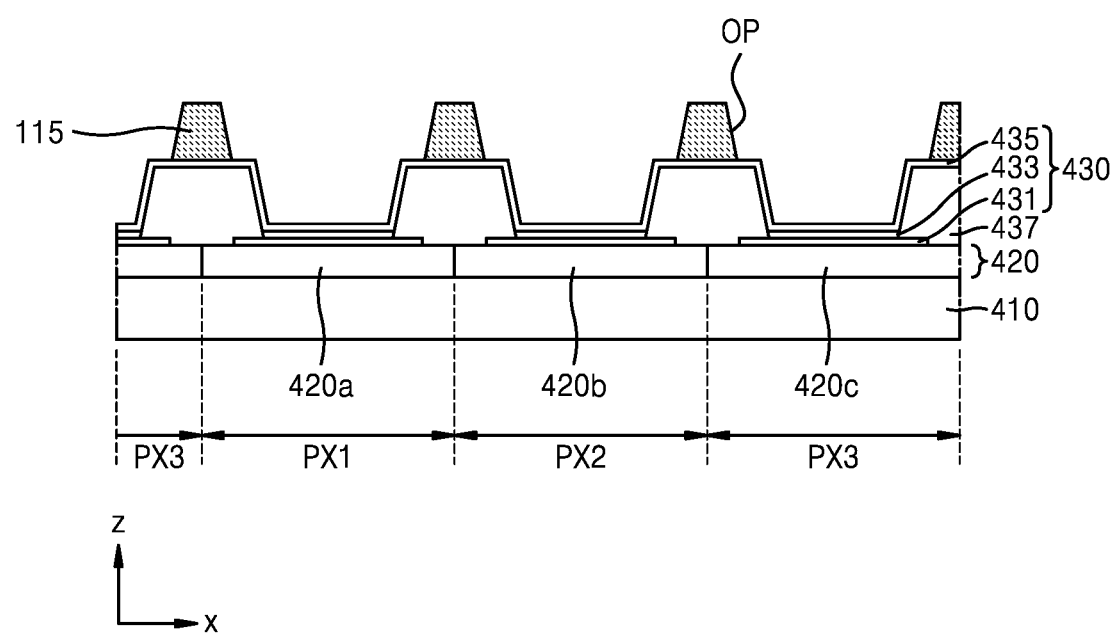
FIGS. 15A to 15H are schematic cross-sectional views for explaining a process of manufacturing a color control member according to an embodiment.

Referring to FIG. 15A, the sacrificial pattern 115 may be formed over the pixel-defining layer 437 over the substrate 410. The sacrificial pattern 115 may include a photosensitive organic material. For example, the sacrificial pattern 115 may be formed by coating a photosensitive organic material on an entire surface of the opposite electrode 435 using a method such as a slit coating method and a spin coating method, and then forming an opening OP through a photolithography process. The sacrificial pattern 115 may be formed in the light-blocking area BA, and an upper portion of the display element 430, that is, the opposite electrode 435 may be exposed through the opening OP.

A lateral wall of the sacrificial pattern 115 may be inclined. The sacrificial pattern 115 may have a tapered shape when viewed in cross-section, and may have a width reducing away from the pixel-defining layer 437. A width of the opening OP may increase away from the pixel-defining layer 437.

The first pixel PX1, the second pixel PX2, and the third pixel PX3 may be arranged in the pixel layer 450. The first to third pixel circuits 420a, 420b, and 420c respectively of the first pixel PX1, the second pixel PX2, and the third pixel PX3 may be arranged in the pixel circuit layer 420. The display element 430 may be provided on the pixel circuit layer 420. The display element 430 may include an organic light-emitting diode OLED. The display element 430 may emit light of the third color, for example, blue light Lb, the light having an amount of light controlled by the first to third pixel circuits 420a, 420b, and 420c. The first to third pixel circuits 420a, 420b, and 420c each may or may not partially overlap the display element 430.

The display element 430 may be arranged to correspond to the pixel area PA of the color control member 100c'. The display element 430 may include the pixel electrode 431, the intermediate layer 433, and the opposite electrode 435. A portion of the pixel electrode 431 may be exposed through the opening of the pixel-defining layer 437, and edges of the pixel electrode 431 may be covered by the pixel-defining layer 437. The pixel-defining layer 437 may be arranged to correspond to the light-blocking area BA of the color control member 100.

Figure 15B:
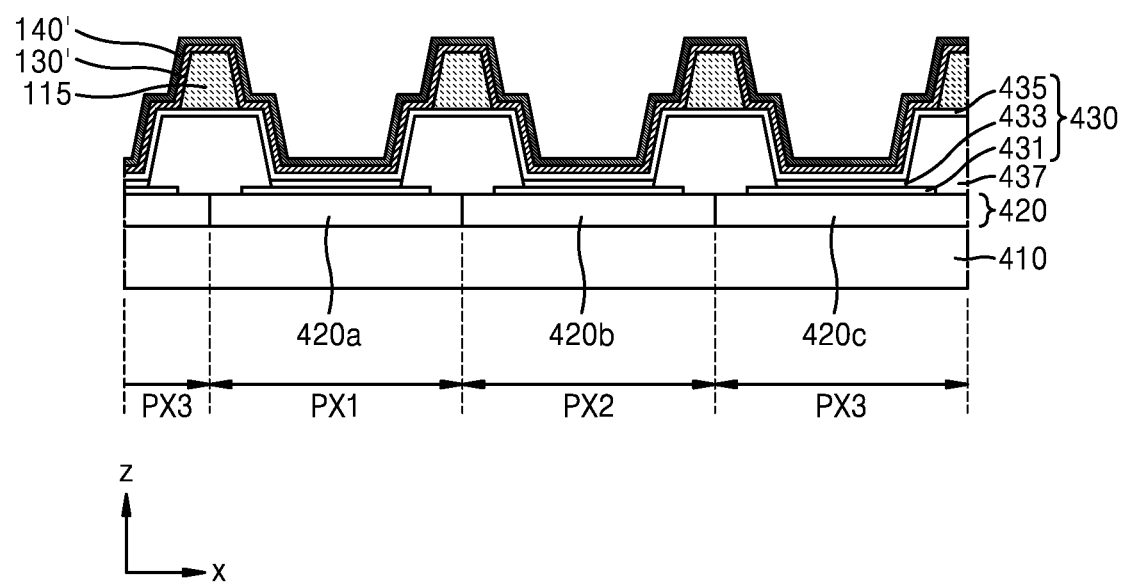

Referring to FIG. 15B, the first material layer 130' and the second material layer 140' may be sequentially formed on the opposite electrode 435. The first material layer 130' and the second material layer 140' may cover the sacrificial pattern 115.

Figure 15C:
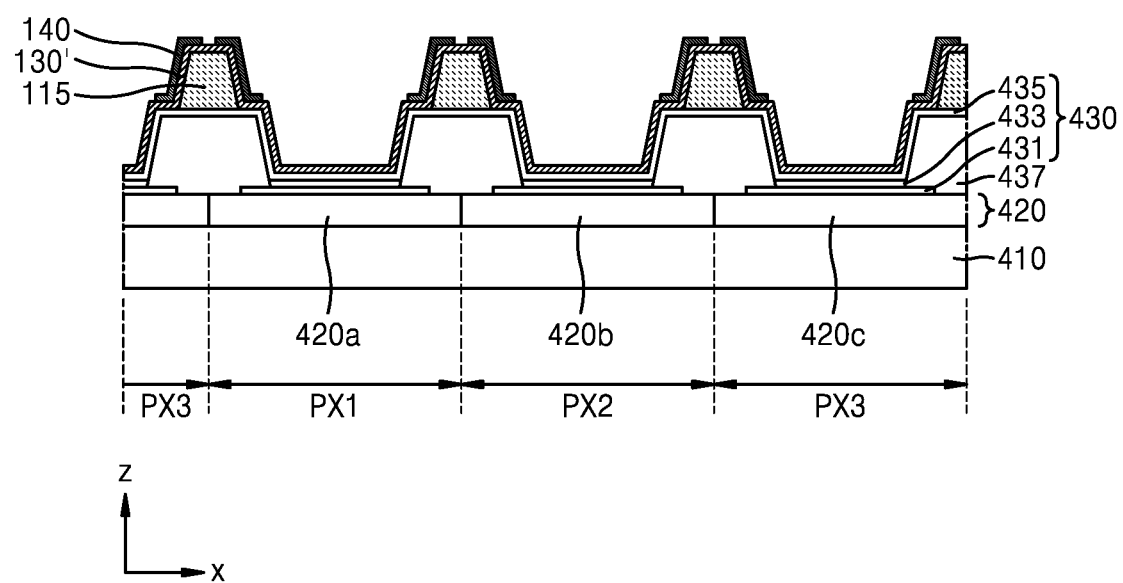

Referring to FIG. 15C, a portion of the second material layer 140' may be removed, and the reflective layer 140 may be formed. The reflective layer 140 may expose the first material layer 130' in the pixel area PA. A through hole TH may be formed in the reflective layer 140. The through hole TH may expose a portion of the first material layer 130' on the sacrificial pattern 115.

Figure 15D:
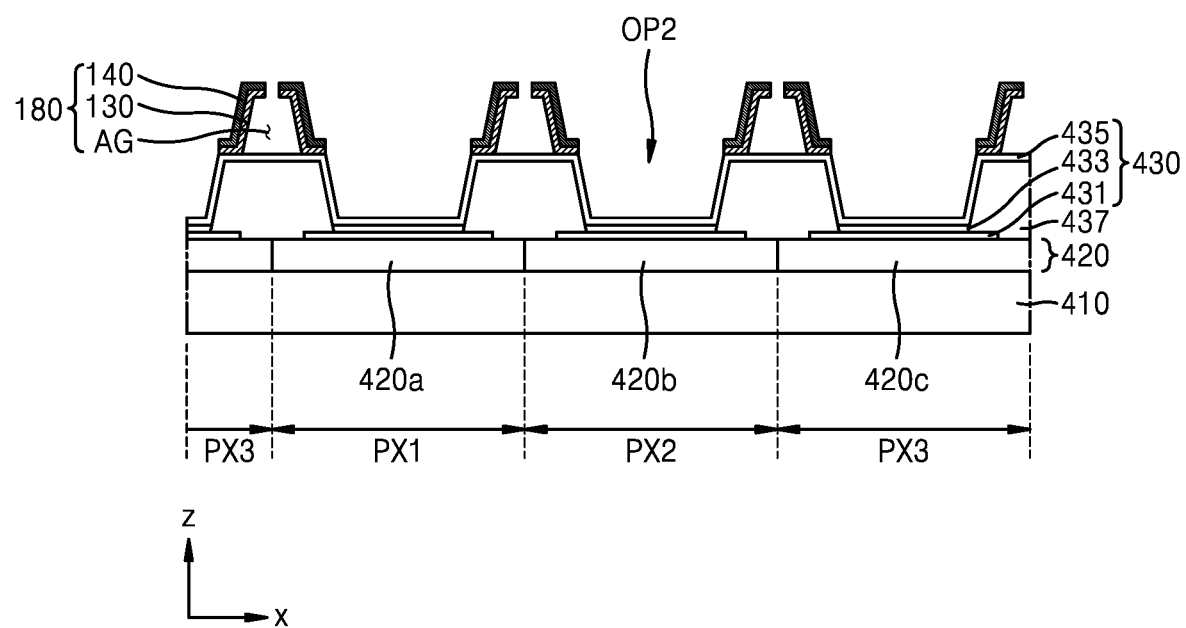

Referring to FIG. 15D, a portion of the first material layer 130' may be removed, and the interface layer 130 including a through hole TH may be formed. The interface layer 130 may expose the opposite electrode 435 in the pixel area PA. The interface layer 130 may be formed by removing a portion of the first material layer 130' by using the reflective layer 140 as a mask. The through hole TH of the interface layer 130 may be aligned with the through hole TH of the reflective layer 140.

The sacrificial pattern 115 may be exposed to the outside by the through holes TH of the interface layer 130 and the reflective layer 140. The sacrificial pattern 115 may be removed through the through holes TH of the interface layer 130 and the reflective layer 140. The interface layer 130 and the opposite electrode 435 may form a space defined by surfaces of the interface layer 130 and the opposite electrode 435. The space may be the air gap of the partition wall 180.

Since the interface layer 130 and the reflective layer 140 are formed, an opening OP2 may be formed, the opening OP exposing an upper portion of the display element in the pixel area PA, that is, an upper portion of the opposite electrode 435. As shown in FIG. 15D, a width of the opening OP2 may increase away from the substrate 410.

Figure 15E:
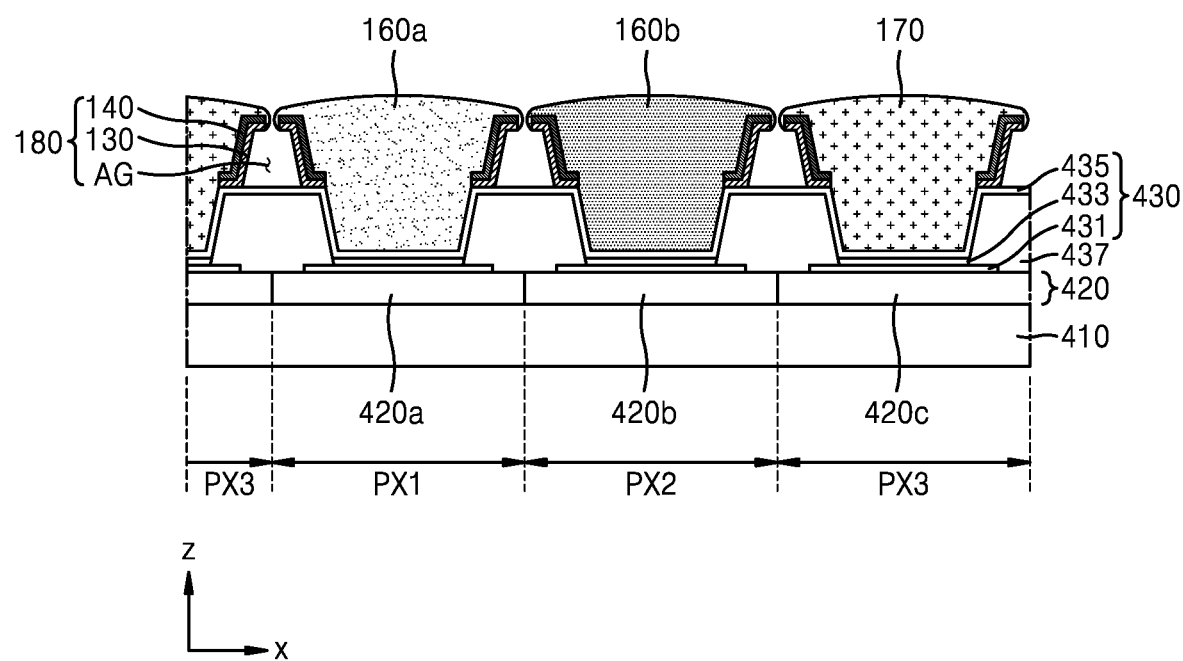
Figure 15F:
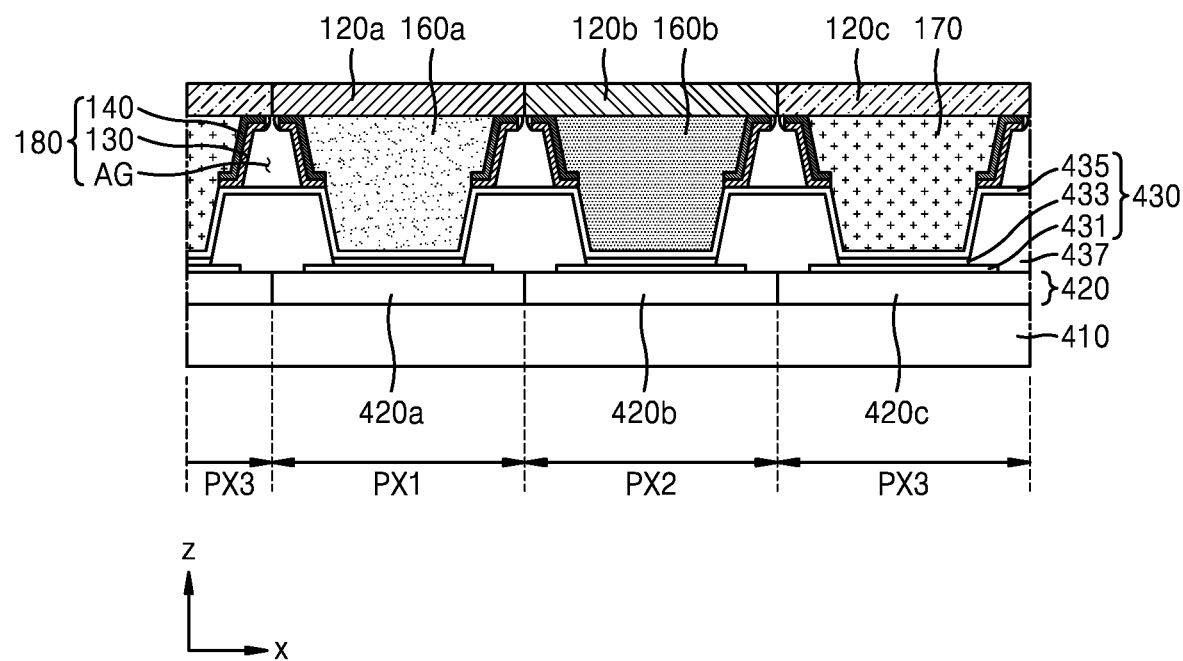

Referring to FIG. 15E, the first color conversion layer 160*a*, the second color conversion layer 160*b*, and the transmission layer 170 each burying the opening OP2 may be formed. The first color conversion layer 160*a*, the second color conversion layer 160*b*, and the transmission layer 170 may be formed by an inkjet coating method. In this case, since liquid drops flowing over to an upper portion of the partition wall 180 due to the inkjet coating method may flow into the air gap AG through the through holes TH, the liquid drops may not flow to a neighboring opening OP2. As shown in FIG. 15F, the liquid drops inside the opening OP2 may be dried and formed at substantially the same level as a top surface of the reflective layer 140.

Referring to FIG. 15F, the first color filter layer 120*a* on the first color conversion layer 160*a*, the second color filter layer 120*b* on the second color conversion layer 160*b*, and the third color filter layer 120*c* on the transmission layer 170 may be further formed. The color filter layer 120 may be formed by repeatedly performing a process of coating a color photoresist on the substrate 410 and then patterning the color photoresist by selectively etching the color photoresist.

Figure 15G:
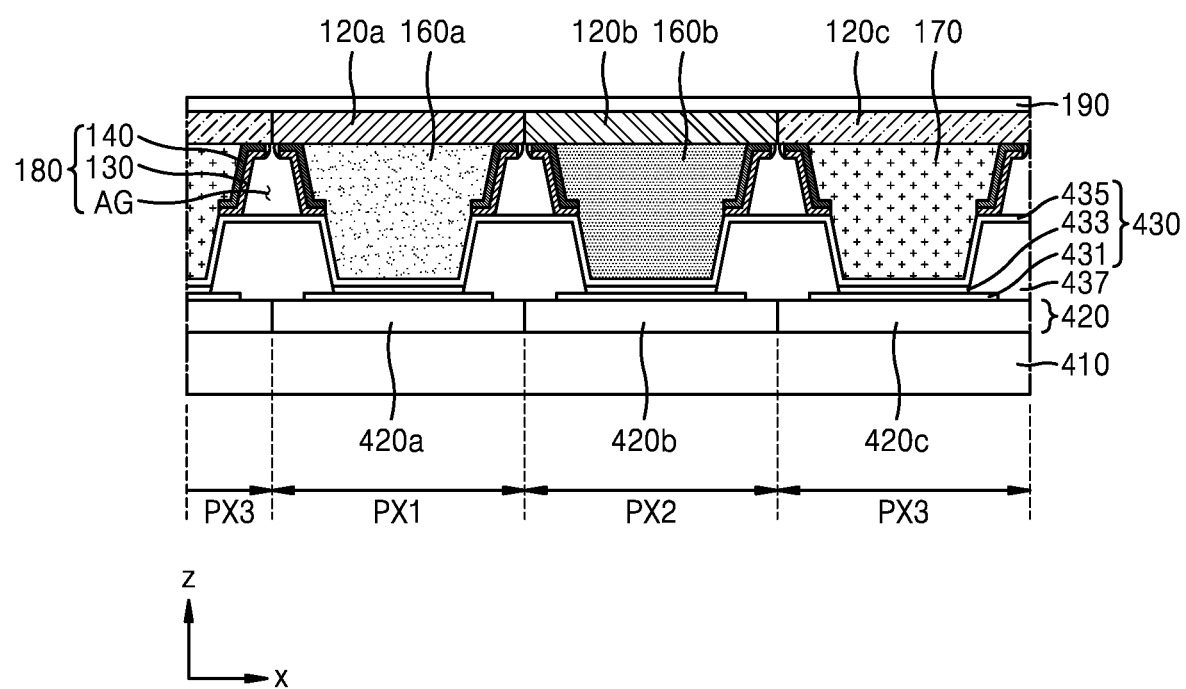

Referring to FIG. 15G, the planarization layer 190 may be further formed on the color filter layer 120.

Figure 15H:
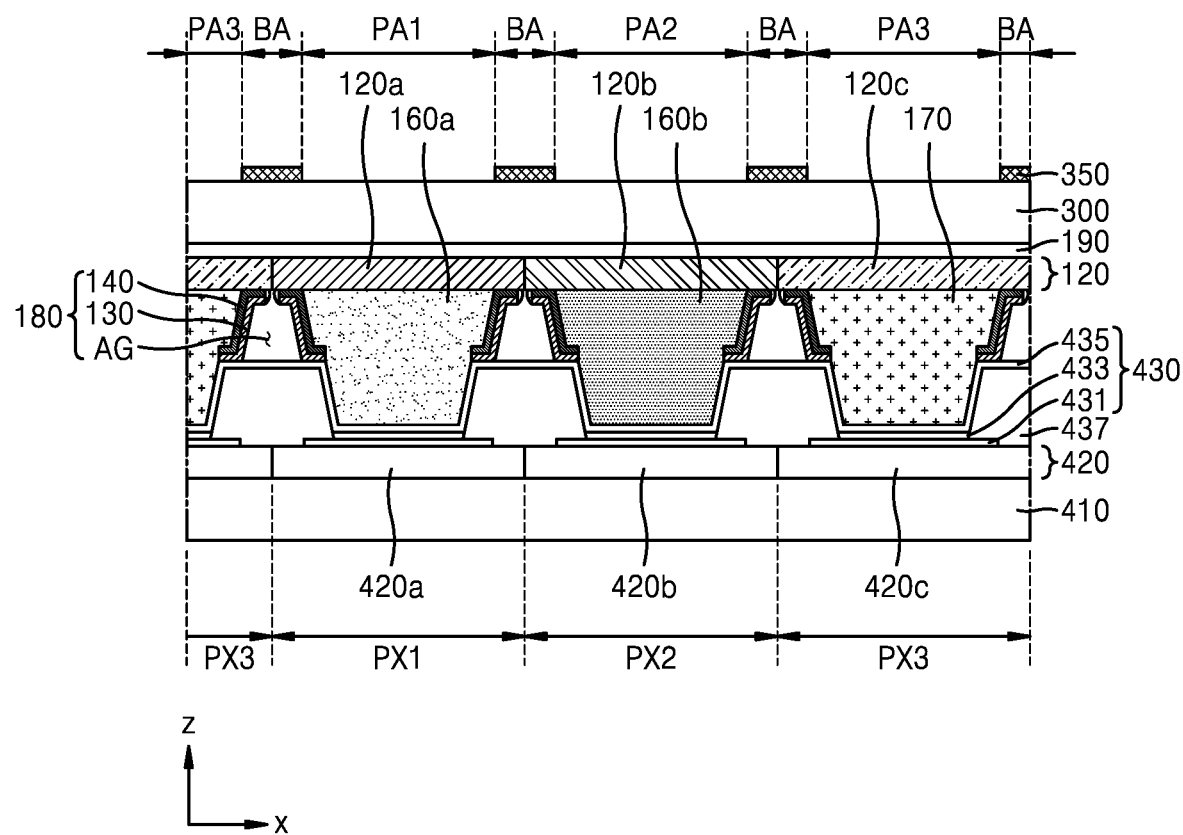

Referring to FIG. 15H, the encapsulation member 300 may be arranged on the planarization layer 190. The encapsulation member 300 may cover the color control member 100*c*' and may be arranged on an entire surface of the substrate 410. The encapsulation member 300 may include a thin-film encapsulation layer.

The light-blocking member 350 may be disposed on the encapsulation member 300. The light-blocking member 350 may be formed in the light-blocking area BA by forming a light-blocking material layer on the encapsulation member 300, then leaving only a portion of the light-blocking material layer, and removing the rest of the light-blocking material layer.

When the partition wall includes an organic material, a high temperature process for hardening the organic material is required. The display device according to embodiments includes a partition wall that defines an air gap as a cavity of the partition wall. The air gap of the partition wall is located between the color conversion layers and the transmission layers of the color control member. Therefore, since a high temperature process such as a process of hardening an organic material may be omitted as a result of usage of the partition wall and its air gap, damage to a layer (e.g. a color filter layer, a display element, etc.) below the color control member due to such a high temperature process may be prevented.

Display devices according to embodiments include a through hole in an interface layer that delimits a partition wall. The partition wall may thus block the inflow of a color conversion material from flowing over from a neighboring pixel area, thereby preventing color mixing between neighboring pixel areas. Also, since a reflective layer is disposed with the interface layer in a direction of light transmission, the escape of the light and mixing of colors of the light that is transmitted in the direction of the light transmission may be prevented.

According to various embodiments, since color mixing between neighboring pixels is prevented by a partition wall between neighboring color conversion layers, a color coincidence rate, a color reproduction rate, and an efficiency of light emitted from the display device may be increased.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A color control member, comprising:
a substrate including a plurality of pixel areas including a first pixel area and a second pixel area;
a first color conversion layer converting incident light on the first color conversion layer to light of a first color, the light of the first color being emitted from the first color conversion layer and through the first pixel area;
a second color conversion layer converting incident light on the second color conversion layer to light of a second color, the light of the second color being emitted from the second color conversion layer and through the second pixel area;
a partition wall disposed in a light-blocking area of the substrate, between the first color conversion layer and the second color conversion layer and defining an air gap corresponding to the light-blocking area of the substrate;
a first color filter layer disposed between the substrate and the first color conversion layer and selectively transmitting the light of the first color emitted from the first color conversion layer;
a second color filter layer disposed between the substrate and the second color conversion layer and selectively transmitting the light of the second color emitted from the second color conversion layer; and
a transmission layer disposed on a third pixel area apart from the first pixel area and the second pixel area and transmitting incident light thereon, wherein
the partition wall is disposed between the transmission layer and the first color conversion layer, and between the transmission layer and the second color conversion layer,
the partition wall includes an interface layer including a first portion and a second portion, the first portion being inclined with respect to the substrate by a predetermined angle, and the second portion being connected to the first portion and spaced apart from the substrate by a predetermined interval in a vertical direction, and
the second portion of the interface layer includes a through hole.

2. The color control member of claim 1, wherein the interface layer further includes a third portion disposed in the plurality of pixel areas of the substrate and connected to the first portion opposite the connection of the second portion to the first portion.

3. The color control member of claim 1, wherein the partition wall further includes a reflective layer disposed on at least one of the first portion and the second portion of the interface layer.

4. The color control member of claim 3, wherein the second portion of the interface layer includes a first through hole, and the reflective layer includes a second through hole disposed to overlap the first through hole of the interface layer.

5. The color control member of claim 1, further comprising:

a light-blocking member disposed between the substrate and the partition wall, and in the air gap.

6. A display device comprising:

a first substrate including a plurality of pixel areas including a first pixel area and a second pixel area;

a first color conversion layer converting incident light on the first color conversion layer to light of a first color, the light of the first color being emitted from the first color conversion layer and through the first pixel area;

a second color conversion layer converting incident light on the second color conversion layer to light of a second color, the light of the second color being emitted from the second color conversion layer and through the second pixel area;

a partition wall disposed in a light-blocking area of the substrate, between the first color conversion layer and the second color conversion layer, and defining an air gap corresponding to the light-blocking area of the first substrate;

a second substrate facing the first substrate;

a plurality of display elements disposed on the second substrate and including a first display element and a second display element emitting the incident light respectively on the first color conversion layer and the second color conversion layer;

a first color filter layer disposed between the first substrate and the first color conversion layer and selectively transmitting the light of the first color emitted from the first color conversion layer;

a second color filter layer disposed between the first substrate and the second color conversion layer and selectively transmitting the light of the second color emitted from the second color conversion layer; and a transmission layer disposed on a third pixel area apart from the first pixel area and the second pixel area and transmitting incident light thereon, wherein the partition wall is disposed between the transmission layer and the first color conversion layer, and between the transmission layer and the second color conversion layer, the partition wall includes an interface layer including a first portion and a second portion, the first portion being inclined with respect to the first substrate by a predetermined angle, and the second portion being connected to the first portion and spaced apart from the first substrate by a predetermined interval in a vertical direction, and the second portion of the interface layer includes a through hole.

7. The display device of claim 6, wherein the interface layer further includes a third portion disposed in the plurality of pixel areas of the first substrate and connected to the first portion opposite the connection of the second portion to the first portion.

8. The display device of claim 6, wherein the partition wall further includes a reflective layer disposed on at least one of the first portion and the second portion of the interface layer.

9. The display device of claim 8, wherein the second portion of the interface layer includes a first through hole, and the reflective layer includes a second through hole disposed to overlap the first through hole of the interface layer.

10. The display device of claim 6, further comprising:

a light-blocking member disposed between the first substrate and the partition wall, and in the air gap.

11. A display device, comprising:

a substrate;

a first display element and a second display element disposed on the substrate, and each emitting light;

a pixel-defining layer disposed on the substrate, and around the first display element and the second display element;

a first color conversion layer disposed on the first display element, and converting light emitted from the first display element to light of a first color, the light of the first color being emitted from the first color conversion layer;

a second color conversion layer disposed on the second display element, and converting light emitted from the second display element to light of a second color, the light of the second color being emitted from the second color conversion layer;

a partition wall disposed on the pixel-defining layer, between the first color conversion layer and the second color conversion layer, and defining an air gap locating on the pixel-defining layer;

a first color filter layer disposed on the first color conversion layer and selectively transmitting the light of the first color emitted from the first color conversion layer; and a second color filter layer disposed on the second color conversion layer and selectively transmitting the light of the second color emitted from the second color conversion layer;

an encapsulation member disposed between the first display element and the second display element of the plurality of display elements and the first color conversion layer and the second color conversion layer, and to cover at least the first display element and the second display element of the plurality of display elements and the pixel-defining layer; and a light-blocking member disposed between the encapsulation member and the partition wall, and in the air gap, wherein the partition wall includes an interface layer including a first portion and a second portion, the first portion being inclined with respect to the substrate by a predetermined angle, and the second portion being connected to the first portion and spaced apart from the pixel-defining layer by a predetermined interval in a vertical direction, and the second portion of the interface layer includes a through hole.

12. The display device of claim 11, wherein the interface layer further includes a third portion disposed on at least one of the first display element and the second display element, and connected to the first portion opposite the connection of the second portion to the first portion.

13. The display device of claim 11, wherein the partition wall further includes a reflective layer disposed on at least one of the first portion and the second portion of the interface layer.

14. The display device of claim 13, wherein the second portion of the interface layer includes a first through hole, and
the reflective layer includes a second through hole disposed to overlap the first through hole of the interface layer.

15. A display device, comprising:
a substrate;
a first display element and a second display element disposed on the substrate, and each emitting light;
a pixel-defining layer disposed on the substrate, and around the first display element and the second display element;
a first color conversion layer disposed on the first display element, and converting light emitted from the first display element to light of a first color, the light of the first color being emitted from the first color conversion layer;
a second color conversion layer disposed on the second display element, and converting light emitted from the second display element to light of a second color, the light of the second color being emitted from the second color conversion layer;
a partition wall disposed on the pixel-defining layer, between the first color conversion layer and the second color conversion layer, and defining an air gap locating on the pixel-defining layer;
a first color filter layer disposed on the first color conversion layer and selectively transmitting the light of the first color emitted from the first color conversion layer; and
a second color filter layer disposed on the second color conversion layer and selectively transmitting the light of the second color emitted from the second color conversion layer;
an encapsulation member disposed to cover the first color filter layer and the second color filter layer; and
a light-blocking member disposed on the encapsulation member and to overlap the air gap, wherein
the partition wall includes an interface layer including a first portion and a second portion, the first portion being inclined with respect to the substrate by a predetermined angle, and the second portion being connected to the first portion and spaced apart from the pixel-defining layer by a predetermined interval in a vertical direction, and
the second portion of the interface layer includes a through hole.

* * * * *